United States Patent
Izumi

(10) Patent No.: US 7,728,370 B2
(45) Date of Patent: Jun. 1, 2010

(54) SEMICONDUCTOR DEVICE AND MANUFACTURING METHOD OF THE SAME

(75) Inventor: Kazutoshi Izumi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 106 days.

(21) Appl. No.: 11/946,444

(22) Filed: Nov. 28, 2007

(65) Prior Publication Data

US 2008/0121958 A1    May 29, 2008

(30) Foreign Application Priority Data

Nov. 29, 2006   (JP)  .............................. 2006-322398

(51) Int. Cl.
*H01L 27/108*   (2006.01)
(52) U.S. Cl. ................... 257/296; 257/295; 257/298; 257/300; 257/532; 257/E29.343
(58) Field of Classification Search .................. 257/295, 257/296, 298, 300, 532, E29.343
See application file for complete search history.

(56) References Cited

U.S. PATENT DOCUMENTS 6,611,014 B1    8/2003   Kanaya et al.
6,982,453 B2    1/2006   Kanaya et al.
7,132,709 B2 *  11/2006  Nagano et al. ............. 257/306
2004/0084701 A1 5/2004   Kanaya et al.

FOREIGN PATENT DOCUMENTS

JP    2002-280528 A    9/2002

* cited by examiner

*Primary Examiner*—Tan N Tran
(74) *Attorney, Agent, or Firm*—Westerman, Hattori, Daniels & Adrian, LLP

(57) ABSTRACT

A stacked film of a first insulation film being a silicon oxide film with an extremely low moisture content, and a second insulation film being a silicon oxide film with a higher moisture content than the first insulation film, therefore, with a low in-plane film thickness distribution rate is formed, and this is polished by CMP. Polishing is performed until the second insulation film is wholly removed directly above a ferroelectric capacitor structure and a surface of the first insulation film is exposed to some extent. At this time, surface flattening is performed for a top surface of a first portion in the first insulation film and a top surface of the second insulation film, and an interlayer insulation film constituted of the first insulation film and the second insulation film remaining on a second portion of the first insulation film is formed.

4 Claims, 24 Drawing Sheets

SEMICONDUCTOR DEVICE AND MANUFACTURING METHOD OF THE SAME

CROSS-REFERENCE TO RELATED APPLICATIONS

This application is based upon and claims the benefit of priority from the prior Japanese Patent Application No. 2006-322398, filed on Nov. 29, 2006, the entire contents of which are incorporated herein by reference.

TECHNICAL FIELD

The present invention relates to a semiconductor device having a capacitor structure formed by sandwiching a dielectric film between a lower electrode and an upper electrode, and a manufacturing method of the same.

BACKGROUND

In recent years, development of a ferroelectric memory (FeRAM) that holds information in a ferroelectric capacitor structure by using polarization inversion of ferroelectrics has been pursued. A ferroelectric memory especially attracts attention because it is a nonvolatile memory which does not lose information held therein even when the power supply is cut off, and realization of high integration density, high-speed drive, high durability and low power consumption can be expected from it.

As the material of the ferroelectric film constituting the ferroelectric capacitor structure, a ferroelectric oxide having a perovskite crystal structure such as a PZT ($Pb(Zr, Ti)O_3$) film with a large remnant polarization amount, for example, of about 10($\mu C/cm^2$) to 30($\mu C/cm^2$), and an SBT ($SrBi_2Ta_2O_9$) film is mainly used.

In a capacitor structure, especially, in a ferroelectric capacitor structure, it is known that the characteristics of a ferroelectric film degrades by moisture entering from an outside through an interlayer insulation film having high affinity with water such as a silicon oxide film. Namely, the moisture entering from the outside is decomposed into hydrogen and oxygen in the high-temperature process at the time of deposition of an interlayer insulation film and metal wiring. If the hydrogen enters the ferroelectric film, it reacts with oxygen in the ferroelectric film to form oxygen deficiency in the ferroelectric film to degrade crystallinity. A similar phenomenon occurs due to long-term use of a ferroelectric memory. As a result, performance degradation of the ferroelectric capacitor structure such as reduction in the remnant polarization amount and dielectric constant of the ferroelectric film, or the like occurs. Further, such entry of hydrogen sometimes degrades the performances of not only the ferroelectric capacitor structure but also the transistor and the like.

Accordingly, in order to prevent entry of moisture/hydrogen into the ferroelectric capacitor structure, the ferroelectric capacitor structure is covered with a thin film (hydrogen diffusion prevention film) of alumina ($Al_2O_3$) or the like, having the function of preventing diffusion of hydrogen, and in order to form an insulation film with an extremely low moisture content as an interlayer insulation film covering the ferroelectric capacitor structure via the hydrogen diffusion prevention film, a silicon oxide film is formed by a plasma CVD method using a source gas including, for example, TEOS. By forming the silicon oxide film as the interlayer insulation film under a so-called extremely low moisture content condition, entry of moisture/hydrogen into the ferroelectric capacitor structure can be prevented as much as possible in corporation with the hydrogen diffusion prevention film.

However, the silicon oxide film formed under the above described extremely low moisture content condition has the in-plane film thickness distribution of about 5%, and even when the silicon oxide film is formed to cover the ferroelectric capacitor structure as the interlayer insulation film, and thereafter, surface flattening is performed for it by polishing it with a Chemical Mechanical Polishing method (Chemical-Mechanical Polishing: CMP method), its in-plane film thickness distribution is large. Therefore, the influence of the ferroelectric capacitor structure on the ferroelectric characteristics, variation in the contact resistance, and the like become problems.

SUMMARY

The present invention is directed to various embodiments of a semiconductor device and a method for manufacturing the semiconductor device having an interlayer insulation film that prevents entry of moisture/hydrogen into a capacitor structure, but has extremely low in-plane film thickness distribution and extremely excellent surface flatness.

DETAILED DESCRIPTION OF THE EMBODIMENTS

Figure 1A:
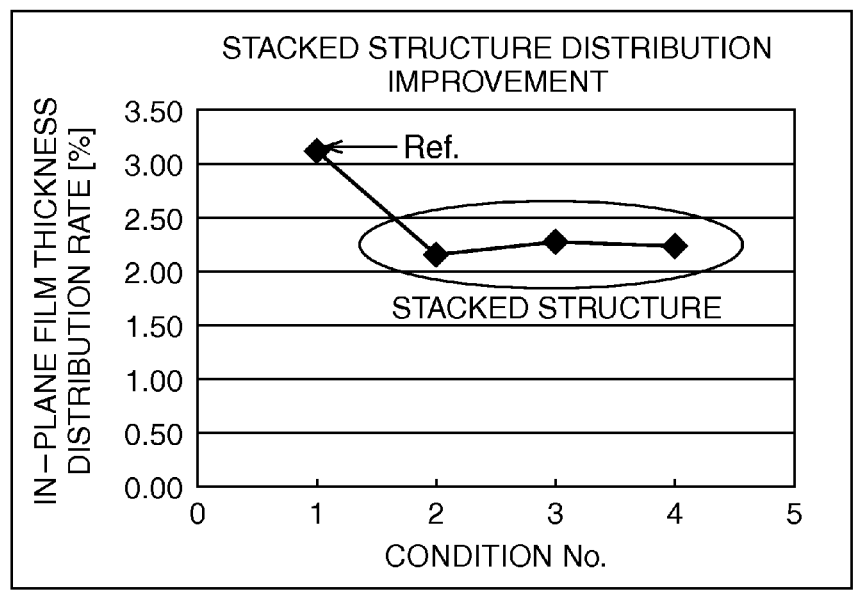
FIGS. 1A and 1B are characteristic charts showing the experiment results in the present invention.

Insulation film usually have the characteristics that the moisture content and the in-plane film thickness distribution rate are generally in the relation of tradeoff, those with low moisture contents are inferior (large) in in-plane film thickness distribution rate on the other hand, whereas those excellent (small) in in-plane film thickness distribution rate have high moisture contents on the other hand.

The present inventor has conceived the interlayer insulation film formed by stacking at least two insulation films differing in moisture content, as a result of earnestly studying to realize excellent surface flatness while sufficiently keeping the function of shutting off moisture/hydrogen as the interlayer insulation film covering the ferroelectric capacitor structure susceptible to damage especially by moisture/hydrogen, by utilizing the above described mutually contradictory characteristics owned by the insulation film.

The present inventor conducted the following experiments in order to grasp the application mode of the above described interlayer insulation film quantitatively. Here, the present inventor set the environment near an ideal state as the formation environment of the interlayer insulation film, and conducted experiment 1 aiming at obtaining the in-plane film thickness distribution rate (uniformity) in each case by properly depositing the insulating material on the silicon substrate having a flat surface by changing the conditions, and experiment 2 aiming at checking the degassing ($H_2O$) amount in each case by properly depositing the insulating material on the silicon substrate having a flat surface by changing the conditions, and thereafter, performing surface flattening by CMP.

EXPERIMENT (1)

The silicon oxide film is formed in two layers (first and second insulation films) on the silicon substrate having a flat surface, and is set as a sample interlayer insulation film. The first insulation film on the lower layer is a so-called silicon oxide film with an extremely low moisture content which is conventionally used as the interlayer insulation film of the ferroelectric capacitor structure. On the other hand, the second insulation film on the upper layer is a silicon oxide film higher in moisture content than the first insulation film, and accordingly, small in in-plane film thickness distribution rate. In order to form the first and second insulation films here, they are respectively deposited by using a plasma CVD method with, for example, TEOS as a source gas with the pressure set at a relatively high value in the case of the first insulation film, and with the pressure set at a lower value than at the time of forming the first insulation film in the case of the second insulation film. At this time, the first and second insulation films may be deposited by setting the oxygen amount ($O_2$ flow rate) of the source gas at a relatively high value in the case of the first insulation film, and by setting the $O_2$ flow rate at a lower value than at the time of formation of the first insulation film in the case of the second insulation film, instead of adopting the above described pressure condition, or in combination with the above described pressure condition.

In the experiment, the total film thickness of the first and second insulation films was specified to be 1400 nm, and by changing the film thickness of each of the insulation films, the in-plane film thickness distribution rate of the sample interlayer insulation film was calculated. In this case, condition 1 was set as the reference sample, and was set for only the first insulation film, and condition 2 (the first insulation film: 300 nm and the second insulation film: 1100 nm), condition 3 (the first insulation film: 500 nm and the second insulation film: 900 nm), and condition 4 (the first insulation film: 700 nm and the second insulation film: 700 nm) were set. Here, an in-plane film thickness distribution rate Uf is defined as follows.

$$Uf=\{(T\max-T\min)/(T\max+T\min)\}\times 100$$

Here, Tmax represents the maximum value of the film thickness, and Tmin represents the minimum value of the film thickness.

Measurement and calculation results are shown in Table 1 and FIG. 1A.

TABLE 1

STACKED STRUCTURE DISTRIBUTION IMPROVEMENT
ASSESSMENT (As depo) with Bare-Si

| CONDITION (STRUCTURE) | Min FILM THICKNESS [nm] | Max FILM THICKNESS [nm] | Δ(Max − Min) [nm] | AVERAGE VALUE [nm] | IN-PLANE FILM THICKNESS DISTRIBUTION RATE [%] |
|---|---|---|---|---|---|
| CONDITION 1 FIRST INSULATION FILM(SINGLE LAYER) 1.4μ | 1383.3 | 1472.9 | 89.6 | 1435.3 | 3.14 |
| CONDITION 2 (FIRST INSULATION FILM 300 nm + SECOND INSULATION FILM 1100 nm) | 1402.4 | 1464.4 | 62.0 | 1430.5 | 2.16 |
| CONDITION 3 (FIRST INSULATION FILM 500 nm + SECOND INSULATION FILM 900 nm) | 1378.8 | 1443.8 | 65.0 | 1416.7 | 2.30 |
| CONDITION 4 (FIRST INSULATION FILM 700 nm + SECOND INSULATION FILM 700 nm) | 1372.5 | 1435.7 | 63.2 | 1407.9 | 2.25 |

As shown in Table 1 and FIG. 1A, it is found out that as compared with the case of only the first insulation film, in the stacked film of the first and the second insulation films, excellent surface flatness can be obtained. In the experiment, the in-plane film thickness distribution rate of the condition 1 shows a relatively excellent value of 3.14%, but in the first insulation film, the in-plane film thickness distribution rate is usually about 5% or less. The interlayer insulation film with only the second insulation film is originally proved to be unsuitable as the interlayer insulation film of the ferroelectric capacitor structure, and therefore, it was not adopted as the sample, but it is known that the in-plane film thickness distribution rate of the interlayer insulation film with only the second insulation film is about 2% or less.

Deserving special note in the result of the experiment is that the in-plane film thickness distribution rates of the conditions 2 to 4 are substantially equivalent values. This fact means that the in-plane film thickness distribution rate does not so much depend on each film thickness in the first and the second insulation films, and if only the interlayer insulation film is formed of the stacked configuration of the first and the second insulation films, substantially constant excellent surface flatness is obtained.

In the experiment (1), considering easiness, reliability and accuracy of the experiment, the insulation film was simply deposited and formed on the flat surface in order to simplify the experiment form, and the in-plane film thickness distribution was calculated, but it is found out that in the insulation film of which surface is flattened by applying CMP to the deposited insulation film, the in-plane film thickness distribution rate hardly changes.

EXPERIMENT (2)

In the experiment, after the respective sample interlayer insulation films were formed under the conditions 1 to 4 in the experiment (1), surface flattening was performed by polishing each of them by CMP until the film thickness was reduced to 500 nm from 1400 nm. Then, with respect to the respective sample layer insulation films formed under the conditions 1 to 4, which were subjected to surface flattening, the degassing amounts of $H_2O$ were measured by a thermal desorption spectroscopy method (TDS). Here, with respect to the one of the condition 1 to which CMP was not applied, the degassing amount of $H_2O$ was similarly measured.

Figure 1B:
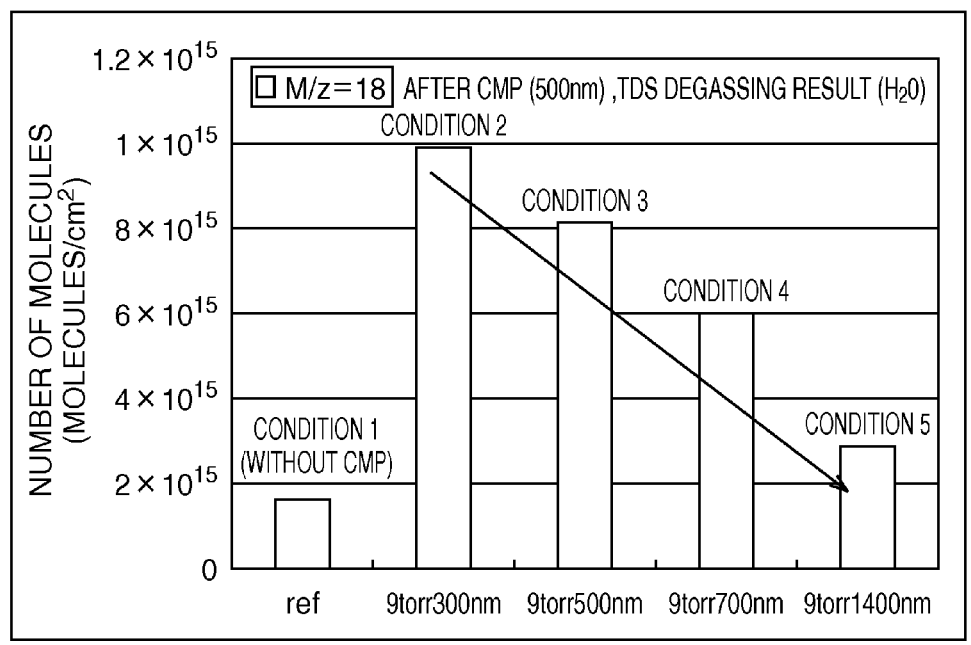

The measurement and calculation results are shown in FIG. 1B.

As shown in FIG. 1B, it has been confirmed that in the sample interlayer insulation film, as the ratio of the second insulation film with a high moisture content is larger, the degassing amount of $H_2O$ is larger, and the degassing amount of $H_2O$ substantially linearly increases in the sequence of the conditions 1, 4, 3 and 2. Here, even the interlayer insulation film showing such a degassing amount as is confirmed in the condition 2 sufficiently performs the function of shutting off moisture/hydrogen to the ferroelectric capacitor structure by the existence of the second insulation film extremely low in moisture content. Further, it has been found out that when CMP is performed in the condition 1, the degassing amount of $H_2O$ increases a little in accordance with the balance of the polishing agent and polishing conditions. In order to obtain the function of further shutting off moisture/hydrogen to the ferroelectric capacitor structure on the basis of the above results, it is effective to apply plasma treatment using, for example, $N_2O$ gas to the interlayer insulation film after the CMP to perform dehydration and surface modification.

Deserving special note in the results of the experiments is that in the conditions 3 and 4, the second insulation films did not remain after the CMP and the sample interlayer insulation films had only the first insulation films. This means that since in the conditions 3 and 4, the second insulation films were formed on the first insulation films as the initial state, their moisture contents increased, and more excellent surface flatness than in the condition 1 was able to be obtained.

Namely, it is found out that in the present invention, when the stacked structure of the first and the second insulation films are first formed, and only the first insulation film is left as the interlayer insulation film by polishing by CMP, excellent surface flatness can be obtained while the function of shutting off the moisture/hydrogen to the ferroelectric capacitor structure is sufficiently kept.

On the basis of the results of the experiments (1) and (2), in the present invention, the interlayer insulation film covering the ferroelectric capacitor structure is formed to have the stacked structure of the first insulation film with an extremely low moisture content and the second insulation film having a higher moisture content than the first insulation film, and accordingly, having a small in-plane film thickness distribution rate, and surface flattening is performed by CMP. By adopting the constitution, excellent surface flatness, in concrete, the in-plane film thickness distribution rate of 3% or less, more preferably 2.3% (see the condition 3 of the experiment (1)) can be realized while sufficiently keeping the function of shutting off moisture/hydrogen to the ferroelectric capacitor structure is kept.

As described in the experiment (1), the film thickness ratio of the first insulation film and the second insulation film in the interlayer insulation film hardly influences the in-plane film thickness distribution rate, and even when the second insulation film is lost by polishing and only the first insulation film remains after surface flattening by CMP or the like, substantially constant and excellent surface flatness can be obtained. Accordingly, a predetermined interlayer insulation film can be easily formed without minutely controlling each film thickness of the first and the second insulation films.

From the above, the present invention presents the following invention modes 1 to 3.

Figure 2:
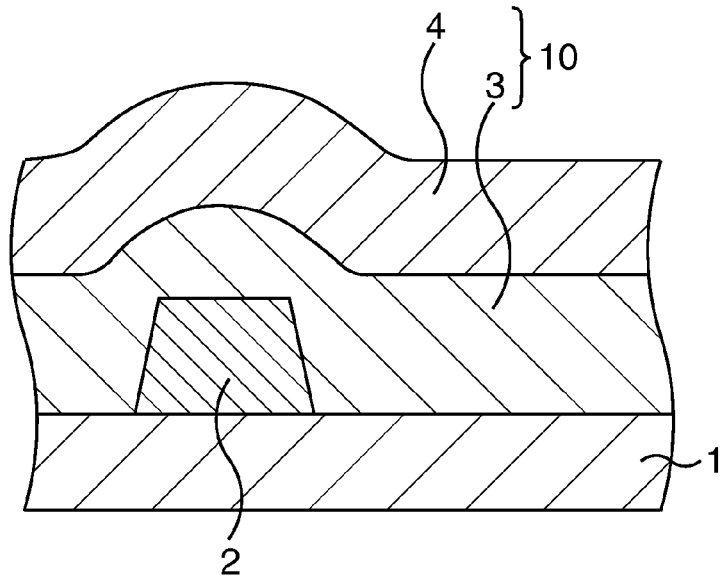
FIG. 2 is a schematic sectional view showing the state in which a first and a second insulation films are formed by being stacked.
Figure 3A:
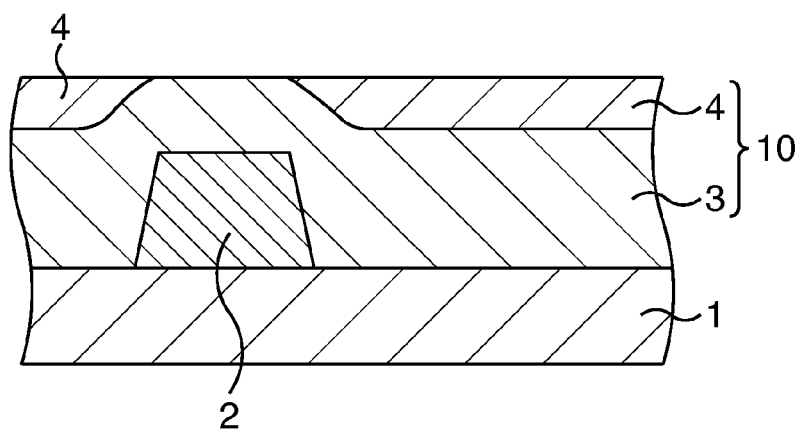
FIGS. 3A and 3B are schematic sectional views showing the state in which surface flattening is performed for the stacked film by CMP and an interlayer insulation film is formed.
Figure 3B:
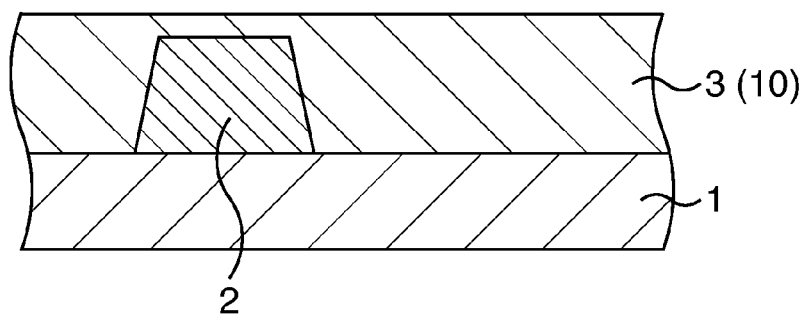
Figure 4A:
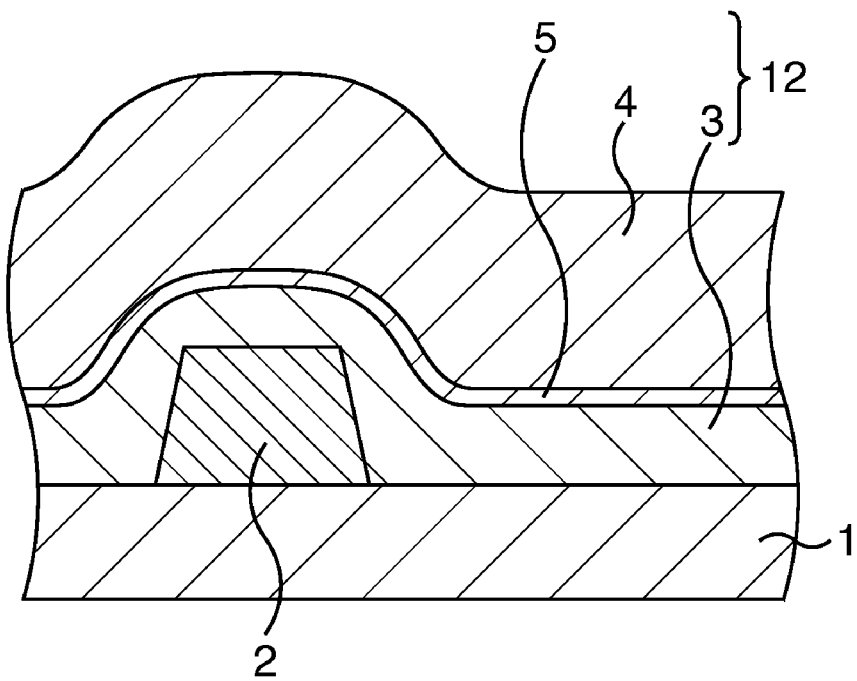
FIGS. 4A and 4B are schematic sectional views showing the state of forming an interlayer insulation film of an invention mode 3.
Figure 4B:
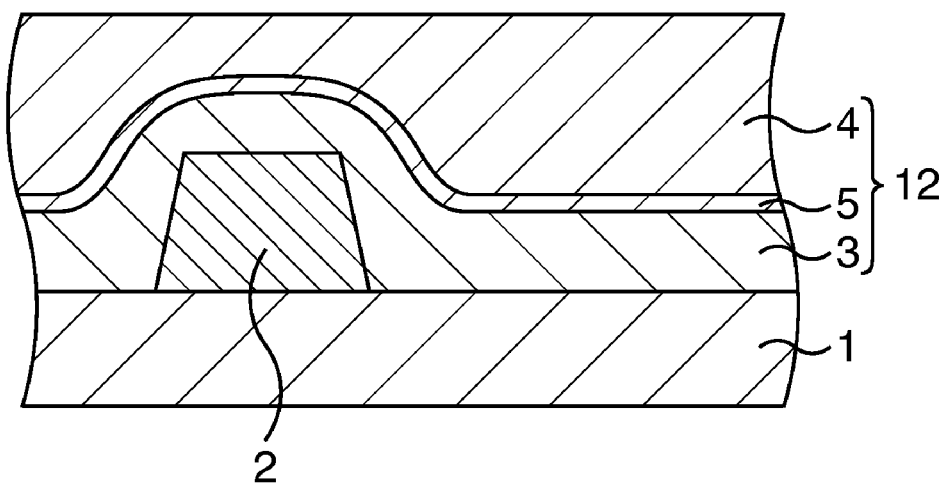

FIG. 2 is a schematic sectional view showing the state in which the first and the second insulation films are formed by being stacked. FIGS. 3A and 3B are schematic sectional views showing the state in which surface flattening is performed for the stacked film by CMP and the interlayer insulation film is formed. FIG. 3A shows the interlayer insulation film of an invention mode 1, whereas FIG. 3B shows the interlayer insulation film of an invention mode 2. FIGS. 4A and 4B are schematic sectional views showing the state of forming the interlayer insulation film of an invention mode 3. Here, the explanation will be made with the simplified state in which the ferroelectric capacitor structure is formed on the substrate in each of FIGS. 2 to 4B shown as an example.

Invention Mode 1

First, as shown in FIG. 2, a first insulation film 3 and a second insulation film 4 are formed by being stacked with the method described in the experiment (1) so as to cover a ferroelectric capacitor structure 2 formed on a base 1. In this case, since the ferroelectric capacitor structure 2 exists, the first and the second insulation films 3 and 4 are formed to be higher in first portions located above the ferroelectric capacitor structure 2 than the other portions 2.

Subsequently, the stacked film is polished by CMP as shown in FIG. 3A. In this case, the stacked film is polished until the second insulation film 4 is wholly removed directly above the ferroelectric capacitor structure 2, and the surface of the first insulation film 3 is exposed to some extent. The second insulation film 4 remains on the second portion of the first insulation film 3. At this time, the top surface of the first portion in the first insulation film 3 and the top surface of the second insulation film 4 are flattened by surface flattening, and an interlayer insulation film 10 constituted of the first insulation film 3 and the second insulation film 4 remaining on the second portion of the first insulation film 3 is formed.

In the interlayer insulation film 10, the ferroelectric capacitor structure 2 is sufficiently protected from the entry of moisture/hydrogen by the first insulation film 3 covering the ferroelectric capacitor structure 2, and more excellent surface flatness can be obtained by the second insulation film 4. In concrete, the in-plane film thickness distribution rate becomes 3% or less.

Invention Mode 2

As shown in FIG. 2, the first insulation film 3 and the second insulation film 4 are formed by being stacked with the method described in the experiment (1) so as to cover the ferroelectric capacitor structure 2 formed on the base 1, as in the invention mode 1.

Subsequently, the stacked film is polished by CMP as shown in FIG. 3B. In this case, the stacked film is polished so that the second insulation film 4 is wholly removed and only the first insulation film 3 remains. At this time, the surface is flattened, and an interlayer insulation film 11 constituted of only the first insulation film 3 is formed.

In the interlayer insulation film 11, the ferroelectric capacitor structure 2 is sufficiently protected from the entry of moisture/hydrogen, and excellent surface flatness can be obtained, though only the first insulation film 3 remains, which has an extremely low moisture content and is inferior in surface flatness when solely used. In concrete, the in-plane film thickness distribution rate becomes 3% or less.

Invention Mode 3

First, as shown in FIG. 4A, by the method described in the experiment (1), the first insulation film 3, a thin hydrogen diffusion prevention film 5 of alumina ($Al_2O_3$) or the like covering the first insulation film 3, and the second insulation film 4 are formed in sequence by being stacked so as to cover the ferroelectric capacitor structure 2 formed on the base 1. In this case, the ferroelectric capacitor structure 2 is sufficiently shut off from entry of moisture/hydrogen by the hydrogen diffusion prevention film 5 in cooperation with the first insulation film 3, and therefore, the second insulation film 4 may be formed to be much thicker than (for example, about three times as thick as) the first insulation film 3.

Subsequently, the stacked film is polished by CMP as shown in FIG. 4B. In this case, only the second insulation film 4 is polished. At this time, the surface of the second insulation film 4 is flattened, and an interlayer insulation film 12 formed by sequentially stacking the first insulation film 3, the hydrogen diffusion prevention film 5 and the second insulation film 4 is formed.

In the interlayer insulation film 12, the ferroelectric capacitor structure 2 is sufficiently protected from the entry of moisture/hydrogen by the first insulation film 3 and the hydrogen diffusion prevention film 5 which cover the ferroelectric capacitor structure 2, and excellent surface flatness can be obtained by the second insulation film 4. In concrete, the in-plane film thickness distribution rate becomes 3% or less.

Concrete Embodiments to which the Present Invention is Applied

Hereinafter, concrete embodiments to which the present invention is applied will be described in detail with reference to the drawings. In the embodiments, the case in which the present invention is applied to an FeRAM including a ferroelectric capacitor which is formed by applying a ferroelectric film to a capacitor film will be shown as an example. In each of the embodiments, the configuration of the FeRAM will be described with its manufacturing method for convenience of explanation. The present invention is also applicable to a semiconductor memory formed by applying an ordinary dielectric film to a capacitor film.

First Embodiment

In this embodiment, a so-called planar type FeRAM with the configuration in which conductive plugs are respectively formed on a lower electrode and an upper electrode of a ferroelectric capacitor structure to obtain electrical continuity is shown as an example.

Figure 5A:
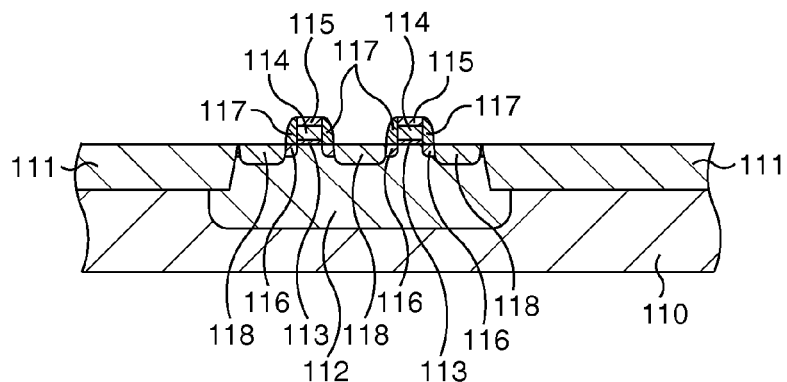
FIGS. 5A to 5Q are schematic sectional views showing a method for manufacturing a planar type FeRAM according to a first embodiment in sequence of the process steps.

Here, the configuration of the planar type FeRAM will be described with its manufacturing method. FIGS. 5A to 5Q are schematic sectional views showing the manufacturing method of the planar type FeRAM according to the embodiment in sequence of the process steps.

First, as shown in FIG. 5A, an MOS transistor 120 which functions as a selection transistor is formed on a silicon semiconductor substrate 110. Here, with the MOS transistor 120, an nMOS transistor which is one of the transistors of a CMOS transistor (not shown) is formed at the same time in a peripheral circuit region. A pMOS transistor which is the other transistor is formed before or after the nMOS transistor.

In detail, an element isolation structure 111 is formed on a surface layer of the silicon semiconductor substrate 110 by, for example, an STI (Shallow Trench Isolation) method, and an element active region is defined.

Next, an impurity, in this case, boron ($B^+$) is ion-implanted into the element active region under the condition of, for example, a dose amount of $3.0\times10^{13}/cm^2$ and acceleration energy of 300 keV, and a well 112 is formed.

Next, a thin gate insulation film 113 with a film thickness of about 3.0 nm is formed in the element active region by thermal oxidation or the like, then, a polycrystalline silicon film of a film thickness of about 180 nm and, for example, a silicon nitride film of a film thickness of about 29 nm are deposited on the gate insulation film 113 by a CVD method, and the silicon nitride film, the polycrystalline silicon film and the gate insulation film 113 are processed into the shape of an electrode by lithography and the subsequent dry etching, whereby gate electrodes 114 are pattern-formed on the gate insulation film 113. At this time, cap films 115 constituted of a silicon nitride film are pattern-formed on the gate electrodes 114 at the same time.

Next, with the cap films 115 as masks, an impurity, in this case, arsenic ($As^+$) is ion-implanted into the element active region under the conditions of, for example, a dose amount of $5.0\times10^{14}/cm^2$, and acceleration energy of 10 keV, and so-called LDD regions 116 are formed.

Next, for example, a silicon oxide film is deposited on the entire surface by a CVD method, and by performing so-called etchback for the silicon oxide film, side wall insulation films 117 are formed by leaving the silicon oxide film only on the side surfaces of the gate electrodes 114 and the cap films 115.

Next, with the cap films 115 and the side wall insulation films 117 as masks, an impurity, in this case, phosphor ($P^+$) is ion-implanted into the element active region under the condition that the impurity concentration becomes higher than in the LDD regions 116, source/drain regions 118 which are overlapped on the LDD region 116 are formed, and the MOS transistor 120 is completed.

Figure 5B:
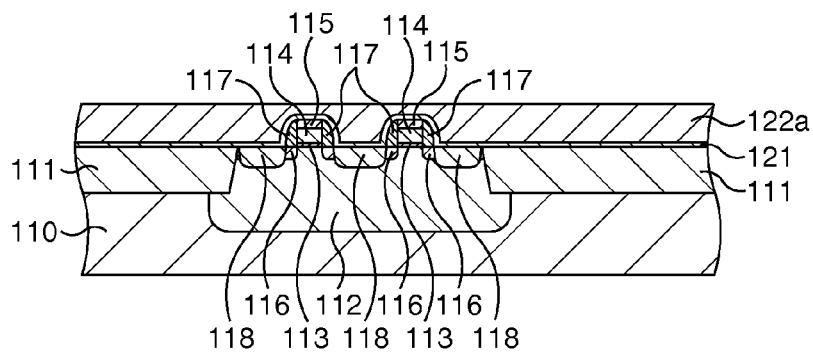

Subsequently, as shown in FIG. 5B, a protection film 121 of the MOS transistor 120 and an interlayer insulation film 122a are sequentially formed on the entire surface.

In detail, the protection film 121 and the interlayer insulation film 122a are sequentially deposited to cover the MOS transistor 120. In this case, as the protection film 121, a silicon oxide film is used as a material, and is deposited to a film thickness of about 20 nm by a CVD method. As the interlayer insulation film 122a, a stacked structure in which, for example, a plasma SiO film (film thickness of about 20 nm), a plasma SiN film (film thickness of about 80 nm) and a plasma TEOS film (film thickness of about 1000 nm) are sequentially deposited is formed, and after stacking them, the stacked structure is polished to a film thickness of about 700 nm by CMP.

Figure 5C:
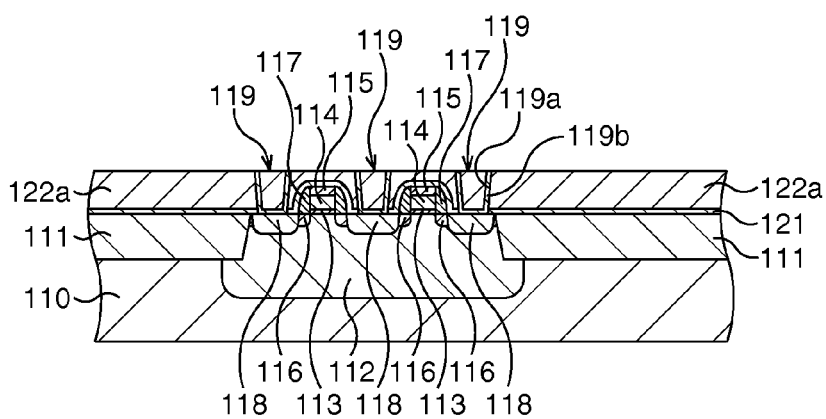

Subsequently, as shown in FIG. 5C, each conductive plug 119 which is connected to the source/drain region 118 of the transistor structure 120 is formed.

In detail, with each of the source/drain regions 118 as an etching stopper, the interlayer insulation film 122a and the protection film 121 are processed by lithography and the subsequent dry etching until a part of the surface of each of the source/drain regions 118 is exposed, and each via hole 119a with a diameter of, for example, about 0.3 μm is formed.

Next, for example, a Ti film and a TiN film are sequentially deposited to a film thickness of about 20 nm and to a film thickness of about 50 nm by a sputtering method so as to cover a wall surface of each of the via holes 119a, and a base film (glue film) 119b is formed. Then, for example, a W film is deposited to fill each of the via holes 119a via the glue film 119b by a CVD method. Thereafter, the w film and the glue film 119b are polished with the interlayer insulation film 122a as a stopper by CMP, and each of the conductive plugs 119 with each of the via holes 119a filled with W via the glue film 119b is formed at the same time. After the CMP, plasma annealing treatment of, for example, $N_2O$ is performed.

Figure 5D:
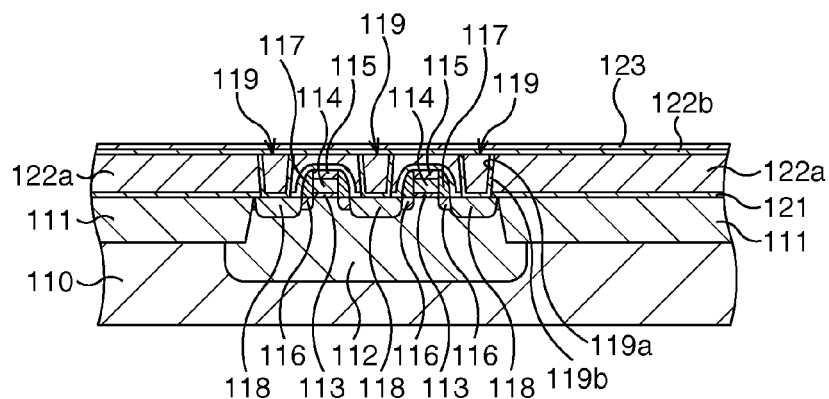

Subsequently, as shown in FIG. 5D, an interlayer insulation film 122b and a hydrogen diffusion prevention film 123 are sequentially formed on the entire surface.

In detail, a silicon oxide film is first deposited on the interlayer insulation film 122a and the conductive plugs 119 to a film thickness of about 100 nm by a plasma CVD method using, for example, TEOS, and the interlayer insulation film 122b is formed. Thereafter, the interlayer insulation film 122b is subjected to annealing treatment. As the condition of the annealing treatment, it is carried out at, for example, 650° C. for 20 minutes to 45 minutes while an $N_2$ gas is supplied at a flow rate of 20 liter/minute.

Next, the hydrogen diffusion prevention film 123 for preventing degradation of the capacitor characteristics of the ferroelectric capacitor which will be described later (preventing entry of hydrogen which generates due to moisture occurring from an outside or the insulation film on the upper layer into the ferroelectric film) is formed on the interlayer insulating film 122b. As the hydrogen diffusion prevention film 123, at least one kind of material selected from the group constituted of $Al_2O_3$ (alumina), Al nitrogen oxide, Ta oxide and Ti oxide, alumina in this case, is used as a material, and is deposited to a film thickness of about 20 nm to 50 nm by a sputtering method or a CVD method (for example, an MOCVD (Metal Organic Chemical Vapor Deposition) method). By adopting the MOCVD method here, a denser alumina film can be formed, and a high hydrogen diffusion prevention effect can be provided. Thereafter, hydrogen diffusion prevention film 123 is subjected to annealing treatment. As the condition of the annealing treatment, it is carried out at, for example, 650° C. for 30 seconds to 120 seconds while an $O_2$ gas is supplied at a flow rate of 2 liters/minute.

Figure 5E:
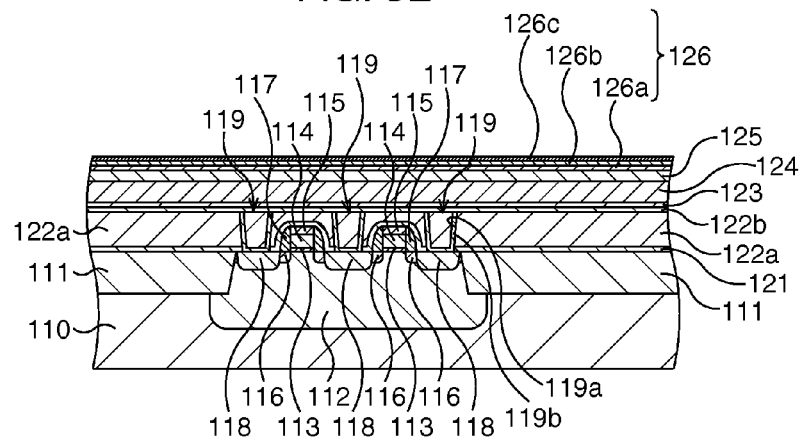

Subsequently, as shown in FIG. 5E, a lower electrode layer 124, a ferroelectric film 125 and an upper electrode layer 126 are sequentially formed on the entire surface.

In detail, a Pt film is first deposited on the hydrogen diffusion prevention film 123 to a film thickness of, for example, about 150 nm to 200 nm by a sputtering method, and the lower electrode layer 124 is formed.

Next, by an RF sputtering method, the ferroelectric film 125 constituted of, for example, $PbZr_{1-x}Ti_xO_3$ (PZT: 0<x<1) which is a ferroelectric substance is deposited on the lower electrode layer 124 to a film thickness of about 100 nm to 300 nm. Then, the ferroelectric film 125 is subjected to annealing treatment and the ferroelectric film 125 is crystallized. As the condition of the annealing treatment, the annealing treatment is carried out at, for example, 550° C. to 650° C. for 60 seconds to 120 seconds while an $Ar/O_2$ gas is supplied at a flow rate of Ar of 1.98 liter/minute and a flow rate of $O_2$ of 0.025 liter/minute. As the material of the ferroelectric film 125, $Pb_{1-x}La_xZr_{1-y}Ti_yO_3$ (0<x<1, 0<y<1), $SrBi_2(Ta_xNb_{1-x})_2O_9$ (0<x<1), $Bi_4Ti_2O_{12}$ or the like may be used instead of PZT.

Next, an upper electrode layer 126 is deposited and formed on the ferroelectric film 125.

As the upper electrode layer 126, an $IrO_2$ film 126a which is a conductive oxide, for example, is first formed to a film thickness of about 30 nm to 70 nm by a reactive sputtering method. Thereafter, the $IrO_2$ film 126a is subjected to annealing treatment. As the conditions of the annealing treatment, the annealing treatment is performed at, for example, 650° C. to 850° C. for 10 seconds to 60 seconds while an $Ar/O_2$ gas is supplied at a flow rate of Ar of 2.0 liter/minute and a flow rate of $O_2$ of 0.02 liter/minute. Next, an $IrO_2$ film 126b is formed on the $IrO_2$ film 126a to a film thickness of about 150 nm to 300 nm by a reactive sputtering method. Then, a noble metal film which functions as a cap film of the $IrO_2$ film 126b, a Pt film 126c in this case, is formed on the $IrO_2$ film 126b to a film thickness of about 100 nm by a sputtering method. The upper electrode layer 126 is constituted of the $IrO_2$ films 126a and 126b and the Pt film 126c. In the upper electrode layer 126, instead of the $IrO_2$ films 126a and 126b, Ir, Ru, $RuO_2$, $SrRuO_3$ and the other conductive oxides or a stacked structure of them may be adopted. Further, formation of the Pt film 126c can be omitted.

Figure 5F:
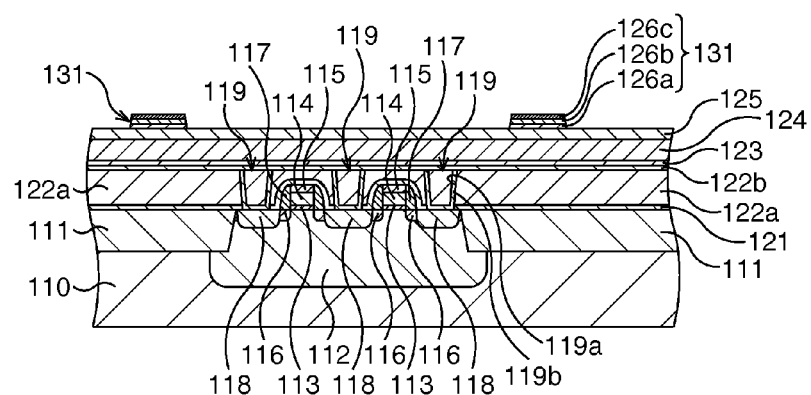

Subsequently, as shown in FIG. 5F, the upper electrodes 131 are pattern-formed.

In detail, the upper electrode layer 126 is processed into a plurality of electrode shapes by lithography and the subsequent dry etching, and the upper electrodes 131 are pattern-formed.

Figure 5G:
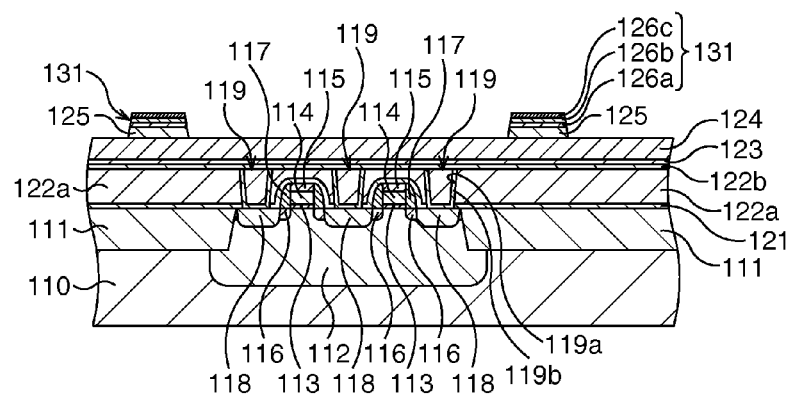

Subsequently, as shown in FIG. 5G, the ferroelectric film 125 is processed.

In detail, the ferroelectric film 125 is matched with the upper electrode 131, and is processed by lithography and the subsequent dry etching. After patterning of the ferroelectric film 125, the ferroelectric film 125 is annealed, and the function of the ferroelectric film 125 is restored.

Figure 5H:
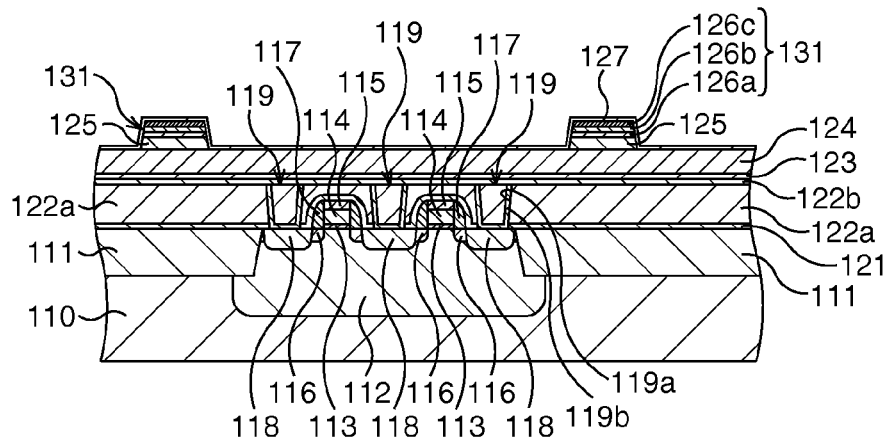

Subsequently, as shown in FIG. 5H, a hydrogen diffusion prevention film 127 for preventing entry of hydrogen/water into the ferroelectric film 125 is formed on the entire surface of the memory cell region and the peripheral circuit region.

In detail, the hydrogen diffusion prevention film 127 is formed by being deposited to a film thickness of about 50 nm on the lower electrode layer 124 to cover the ferroelectric film 125 and the upper electrodes 131 by a sputtering method or a CVD method (for example, an MOCVD method) with at least one kind of material selected from a group constituted of $Al_2O_3$ (alumina), Al nitrogen oxide, Ta oxide, and Ti oxide, alumina in this case, used as the material. By adopting the MOCVD method here, a denser alumina film can be formed, and a high hydrogen diffusion prevention effect can be provided. Thereafter, the hydrogen diffusion prevention film 127 is subjected to annealing treatment.

Figure 5I:
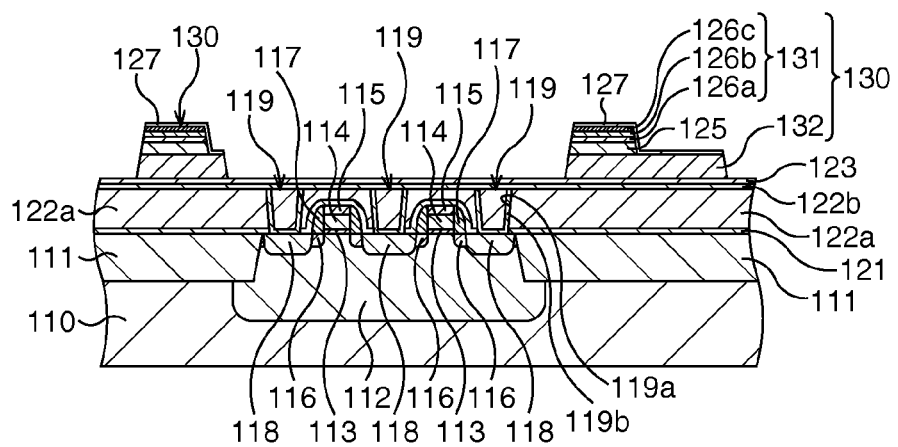

Subsequently, as shown in FIG. 5I, in each of the memory cell region and the peripheral circuit region, the lower electrode layer 124 as well as the hydrogen diffusion prevention film 127 is processed. Thereby, the ferroelectric capacitors 130 are respectively completed.

In detail, the hydrogen diffusion prevention film 127 and the lower electrode layer 124 are matched with the processed ferroelectric film 125, and are processed by lithography and the subsequent dry etching so that the lower electrode layer 124 remains to be in a larger size than the ferroelectric film 125, and a lower electrode 132 is pattern-formed. Thereby, the ferroelectric films 125 and the upper electrodes 131 are sequentially stacked on the lower electrodes 132, and the ferroelectric capacitors 130 in which the lower electrodes 132 and the upper electrodes 131 are capacitively coupled via the ferroelectric films 125, a first smoothing capacitor 151 and a second smoothing capacitor 152 are respectively completed. At this time, the hydrogen diffusion prevention film 127 remains at the same time on the top surfaces of the upper electrodes 131, the side surfaces of the upper electrodes 131 and the ferroelectric capacitor films 125 and the top surface of the lower electrode layer 124 to cover them. Thereafter, the hydrogen prevention film 127 is subjected to annealing treatment.

Figure 5J:
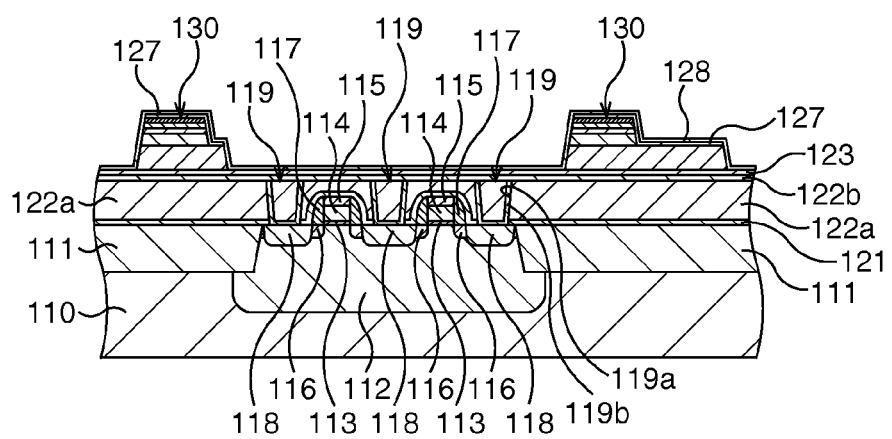

Subsequently, as shown in FIG. 5J, a hydrogen diffusion prevention film 128 is formed on the entire surface.

In detail, the hydrogen diffusion prevention film 128 for preventing degradation of the capacitor characteristics of the ferroelectric capacitors 130 (for preventing entry of hydrogen generated due to moisture occurring from the outside or the insulation film on the upper layer) is formed to cover the entire surface of the ferroelectric capacitors 130. In this case, the ferroelectric capacitors 130 are each formed into the shape completely covered by the hydrogen diffusion prevention films 123, 127 and 128. As the hydrogen diffusion prevention film 128, at least one kind of material selected from the group constituted of $Al_2O_3$ (alumina), Al nitrogen oxide, Ta oxide and Ti oxide, alumina in this case, is used as a material, and is deposited to a film thickness of about 20 nm to 50 nm by a sputtering method or a CVD method (for example, an MOCVD method). In this case, by adopting the MOCVD method, a denser alumina film can be formed, and a high hydrogen diffusion prevention effect can be provided. Thereafter, the hydrogen diffusion prevention film 128 is subjected to annealing treatment.

Figure 5K:
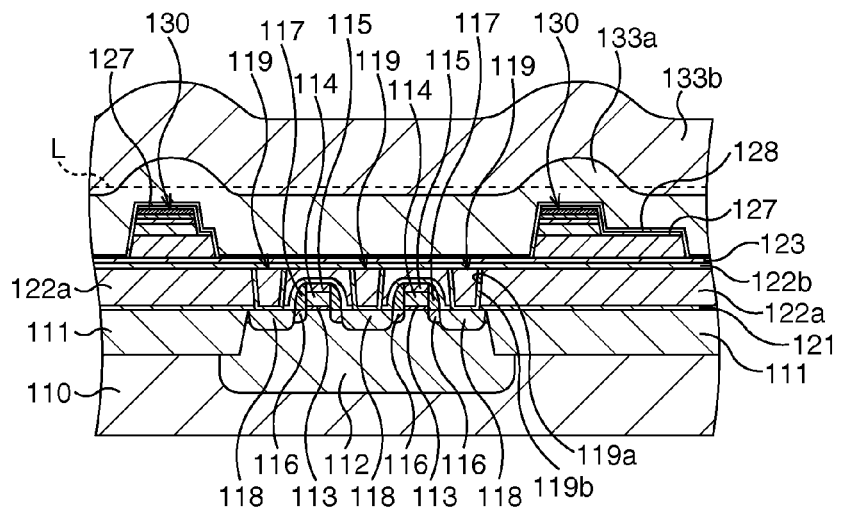

Subsequently, as shown in FIG. 5K, a first insulation film 133a and a second insulation film 133b are sequentially deposited on the entire surface.

In detail, the first insulation film 133a and the second insulation film 133b are sequentially formed so as to cover the ferroelectric capacitors 130 via the hydrogen diffusion prevention films 127 and 128, respectively. The first insulation film 133a is formed to be in the extremely low moisture content state to prevent the ferroelectric capacitors 130 from entry of moisture/hydrogen. On the other hand, the second insulation film 133b is formed into the state excellent in surface flatness, accordingly, in the state with a lower moisture content than the first insulation film 133a. In concrete, the first insulation film 133a is formed from an insulation material of an in-plane film thickness distribution rate of about 5% or less, and the second insulation film 133b is formed from an insulation material of an in-plane film thickness distribution rate of about 2% or less.

From the above described requirement, the first and the second insulation films 133a and 133b are formed as silicon oxide films by a plasma CVD method using, for example, TEOS. In this case, the pressure in the source gas is regulated to be lower at the time of deposition of the second insulation film 133b than at the time of deposition of the first insulation film 133a. Here, in place of the pressure condition, or with the pressure condition, the oxygen amount in the source gas (oxygen flow rate) may be regulated so as to be lower at the time of deposition of the second insulation film 133b than at the time of deposition of the first insulation film 133a. In concrete, plasma CVD is carried out under the conditions of growth temperature: 390°, pressure: $1.2 \times 10^3$ [Pa](9 [Torr]), $O_2$ flow rate: 2980 [sccm], TEOS: 690 [mgm], He: 720 [sccm], RF power: 700 [W] at the time of deposition of the first insulation film 133a, and under the conditions of growth temperature: 390° C., pressure: $6.67 \times 10^2$ [Pa] (t[Torr]), $O_2$ flow rate: 2100 [sccm], TEOS: 690 [mgm], He: 720 [sccm], and RF power: 700 [W] at the time of deposition of the second insulation film 133b. Thereby, for example, the first insulation film 133a is formed to a film thickness of about 500 nm and the second insulation film 133b is formed to a film thickness of about 900 nm. In this case, the first and the second insulation films 133a and 133b are formed to be higher in the first portions located above the ferroelectric capacitor structures 130 than in the second portions other than the first portions since the ferroelectric capacitor structure 130 exists.

Figure 5L:
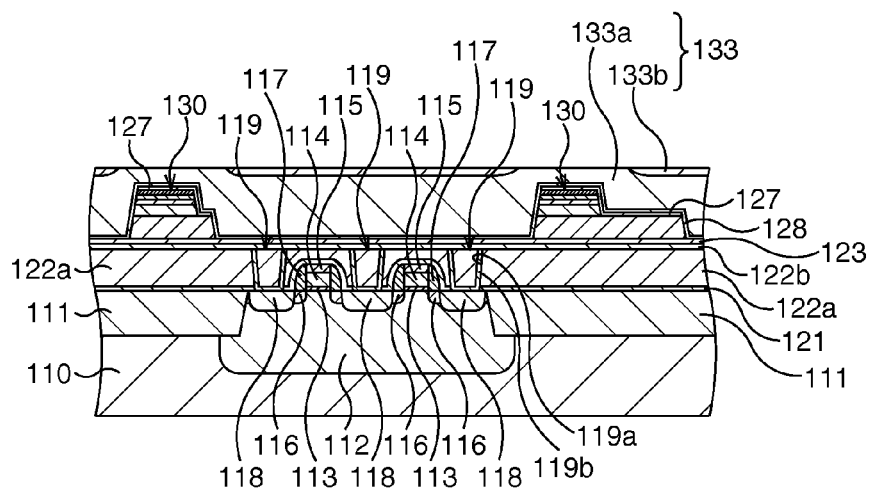

Subsequently, as shown in FIG. 5L, surface flattening is performed by polishing the first and the second insulation films 133a and 133b, and an interlayer insulation film 133 is formed.

In detail, the interlayer insulation film 133 is formed by polishing them until the film thickness becomes, for example, about 700 nm by CMP, up to the position shown by the broken line L in FIG. 5K, for example. Here, polishing is performed until the second insulation film 133b is wholly removed directly above the ferroelectric capacitor structures 130, and the surface of the first insulation film 133a is exposed to some extent. The second insulation film 133b remains on the second portion of the first insulation film 133a. At this time, the top surface of the first portion in the first insulation film 133a and the top surface of the second insulation film 133b are flattened, and the interlayer insulation film 133 constituted of the first insulation film 133a and the second insulation film 133b remaining on the second portion of the first insulation film 133a is formed.

In the interlayer insulation film 133, the ferroelectric capacitor structures 130 are sufficiently protected from entry of moisture/hydrogen by the first insulation film 133a which covers the ferroelectric capacitor structures 130, and excellent surface flatness is obtained by the second insulation film 133b. In concrete, the in-plane film thickness distribution rate becomes 3% or less.

After the CMP, plasma annealing treatment of $N_2O$, for example, is performed for the purpose of dehydration and surface improvement of the interlayer insulation film 133.

Figure 5M:
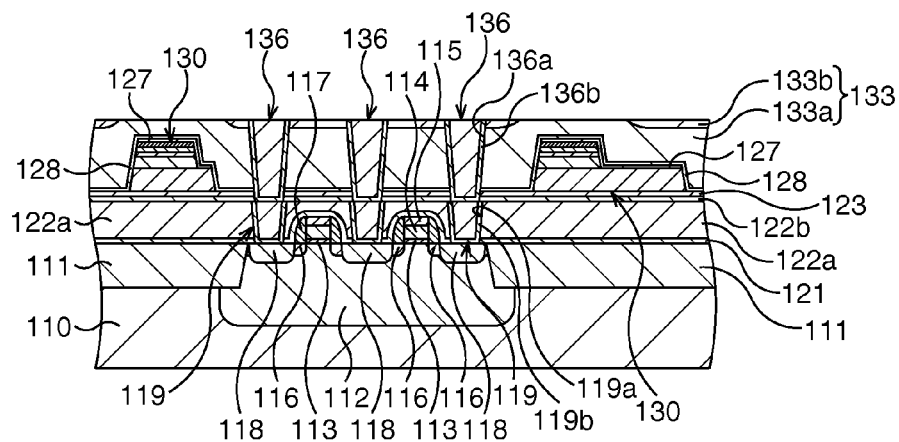

Subsequently, as shown in FIG. 5M, plugs 136 connected to the conductive plugs 119 are formed.

In detail, with each of the conductive plugs 119 as an etching stopper, the interlayer insulation film 133 and the hydrogen diffusion prevention film 123 are processed by lithography and the subsequent dry etching until a part of the surfaces of the conductive plugs 119 are exposed, and each of via holes 136a with a diameter of about 0.3 μm, for example, is formed.

Next, for example, a Ti film and a TiN film are sequentially deposited to a film thickness of about 20 nm and a film thickness of about 50 nm by a sputtering method so as to cover the wall surfaces of the via holes 136a, and base films (glue films) 136b are formed. Then, for example, W films are formed to fill the via holes 136a via the glue films 136b by a CVD method. Thereafter, the W films and the glue films 136b are polished with the interlayer insulation film 133 as a stopper by CMP, and the via holes 136a are filled with the W via the glue films 136b, and the respective conductive plugs 136 connected to the respective conductive plugs 119 are formed. After the CMP, plasma annealing treatment of $N_2O$, for example, is performed.

Figure 5N:
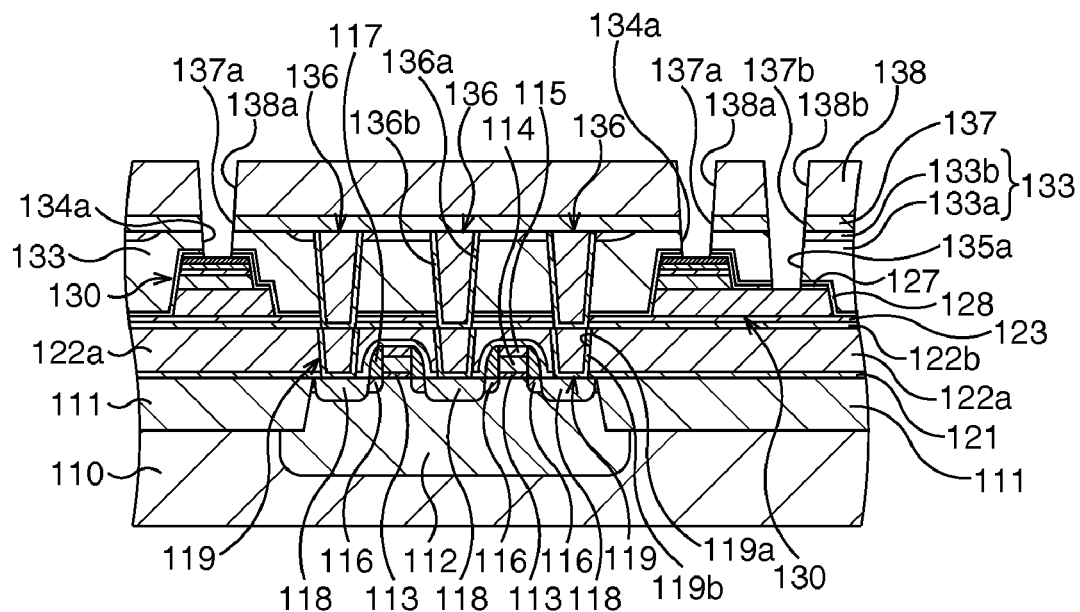

Subsequently, as shown in FIG. 5N, after a hard mask 137 and a resist mask 138 are formed, via holes 134a and 135a to the ferroelectric capacitors 130 are formed respectively.

In detail, first, a silicon nitride film is deposited to a film thickness of about 100 nm on the interlayer insulation film 133 by a CVD method, and the hard mask 137 is formed. Next, a resist is coated on the hard mask 137, the resist is processed by lithography, and the resist mask 138 having openings 138a and 138b is formed.

Next, the hard mask 137 is dry-etched by using the resist mask 138, and openings 137a and 137b are formed in the regions of the hard mask 137, which are matched with the openings 138a and 138b.

Then, by mainly using the hard mask 137, with the upper electrodes 131 and the lower electrodes 132 respectively used as etching stoppers, the interlayer insulation film 133 and the hydrogen diffusion prevention films 128 and 127 are dry-etched. In the dry etching, the processing which is applied to the interlayer insulation film 133 and the hydrogen diffusion prevention films 128 and 127 until parts of the surfaces of the upper electrodes 131 are exposed, and the processing which is applied to the interlayer insulation film 133 and the hydrogen diffusion prevention films 128 and 127 until parts of the surfaces of the lower electrodes 132 are exposed are carried out at the same time, and the via holes 134a and 135a each with a diameter of about 0.5 μm, for example, are formed at the respective regions at the same time.

Figure 5O:
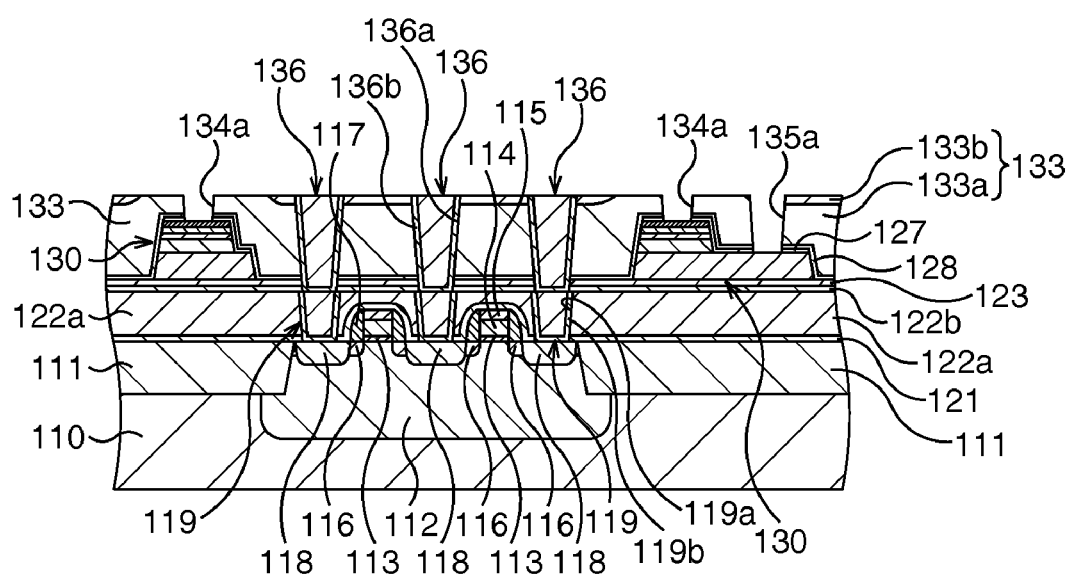

Subsequently, as shown in FIG. 5O, the resist mask 138 and the hard mask 137 are removed.

In detail, first, the remaining resist mask 138 is removed by ashing treatment or the like. Thereafter, annealing treatment is performed to repair the damages which the ferroelectric capacitors 130 suffer due to the various process steps after formation of the ferroelectric capacitors 130. Then, by overall anisotropic etching, so-called etchback, the hard mask 137 is removed.

Figure 5P:
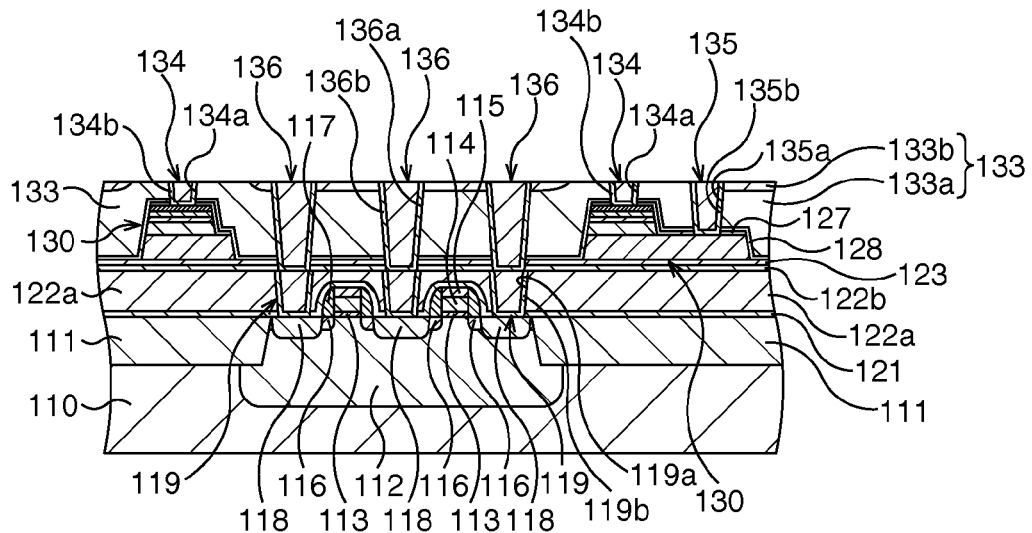
Figure 5Q:
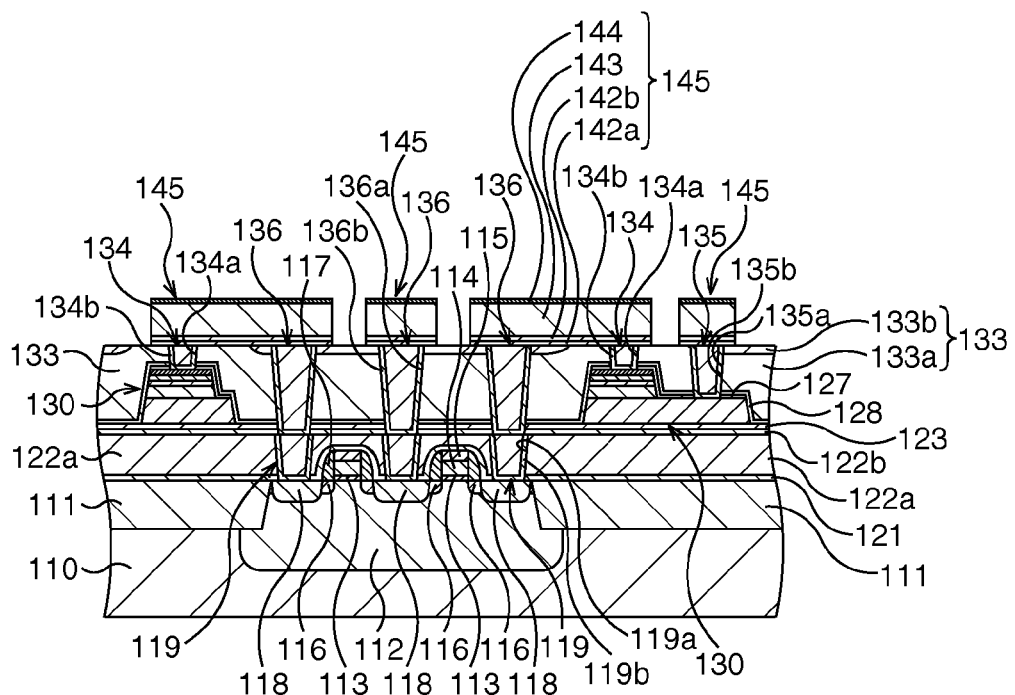

Subsequently, as shown in FIG. 5P, conductive plugs 134 and 135 connected to the ferroelectric capacitors 130 are formed.

In detail, base films (glue films) 134b and 135b are formed to cover the wall surfaces of the via holes 134a and 135a by sequentially depositing, for example, a Ti film to a film thickness of about 20 nm and a TiN film to a film thickness of about 50 nm by a sputtering method. Then, W films are formed by a CVD method to fill the via holes 134a and 135a via the glue films 134b and 135b. Thereafter, with the interlayer insulation film 133 as a stopper, the W films and the glue films 134b and 135b are polished by CMP, and the conductive plugs 134 and 135 in which the insides of the via holes 134a and 135a are filled with the W via the glue films 134b and 135b are formed. Here, the conductive plugs 134 are connected to the upper electrodes 131, and the conductive plug 135 is connected to the lower electrode 132. After the CMP, plasma annealing treatment of $N_2O$, for example, is performed.

Subsequently, as shown in FIG. 5Q, wirings 145 which are respectively connected to the conductive plugs 134, 135 and 136 are formed.

In detail, first, barrier metal films 142a and 142b, a wiring film 143 and a barrier metal film 144 are deposited on the entire surface on the interlayer insulation film 133 by a sputtering method or the like, and a wiring film (not shown) is formed.

As the barrier metal film 142a, for example, a Ti film is deposited to a film thickness of about 60 nm by a sputtering method. As the barrier metal film 142b, a TiN film is deposited to a film thickness of about 12.5 nm. As the wiring film 143, for example, an Al alloy film (Al—Cu film in this case) is deposited to a film thickness of about 400 nm. As the barrier metal film 144, for example, a TiN film is deposited to a film thickness of about 70 nm by a sputtering method.

Next, the wirings 145 which are respectively connected to the conductive plugs 134, 135 and 136 are formed.

In detail, after, for example, an SiON film or an anti-reflection film (not shown) is deposited as the anti-reflection film, the anti-reflection film and the wiring film are processed into the wiring shapes by lithography and the subsequent dry etching, and the respective first wirings 145 which are respectively connected to the conductive plugs 134, 135 and 136 are pattern-formed.

Here, in the memory cell region in FIG. 5Q, the upper electrodes 131 or the lower electrodes 132 are connected to the source/drain regions 118 of the MOS transistors 120 via the conductive plugs 134 or the conductive plugs 135 so that the ferroelectric capacitors 130 function as the memory cell capacitors.

Thereafter, the planar type FeRAM according to this embodiment is completed through the various process steps of forming interlayer insulation films, additional upper layer wirings and the like.

As described above, according to this embodiment, the interlayer insulation film 133 which prevents entry of moisture/hydrogen into the ferroelectric capacitor structures 130 as much as possible, but has extremely low in-plane film thickness distribution and extremely excellent surface flatness is formed, and the planar type FeRAM with high reliability with influence on the dielectric characteristics, variation in contact resistance and the like suppressed is realized.

In this embodiment, the case where the simple planar film is formed as the ferroelectric film 125 is shown as an example, but the present invention can be applied to a so-called three-dimensional capacitor that is made by forming a dielectric film which is not in a simple planar shape.

MODIFIED EXAMPLE

Various modified examples of the first embodiment will be described hereinafter.

In these modified examples, a planar type ReRAM is shown as an example as in the first embodiment, and the modified examples differ from the first embodiment in the respect that the structures of the interlayer insulation films 133 covering the ferroelectric capacitor structures 130 differ from the one in the first embodiment.

Modified Example 1

Figure 6:
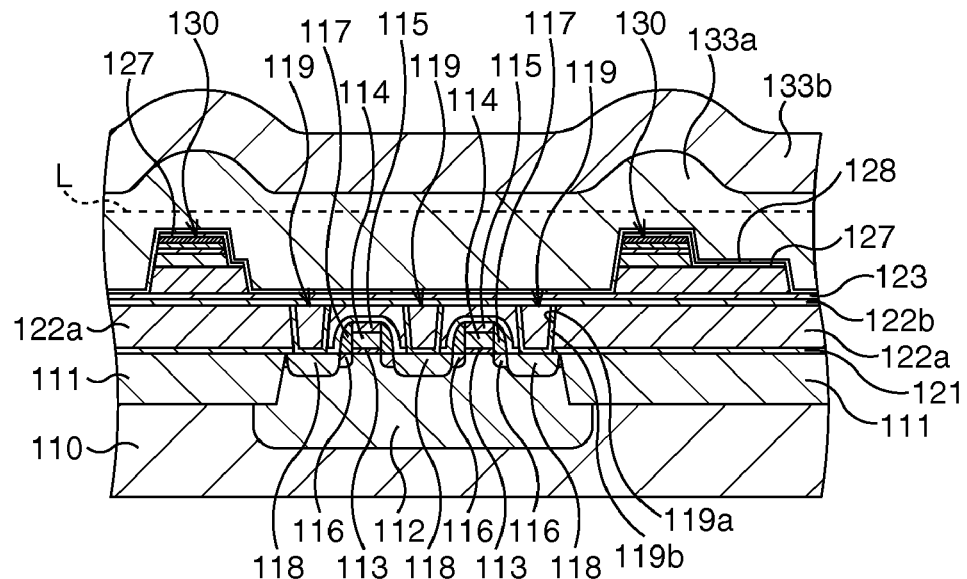
FIG. 6 is a schematic sectional view showing only the main process step in the method for manufacturing the planar type FeRAM according to a modified example 1 of the first embodiment.
Figure 7:
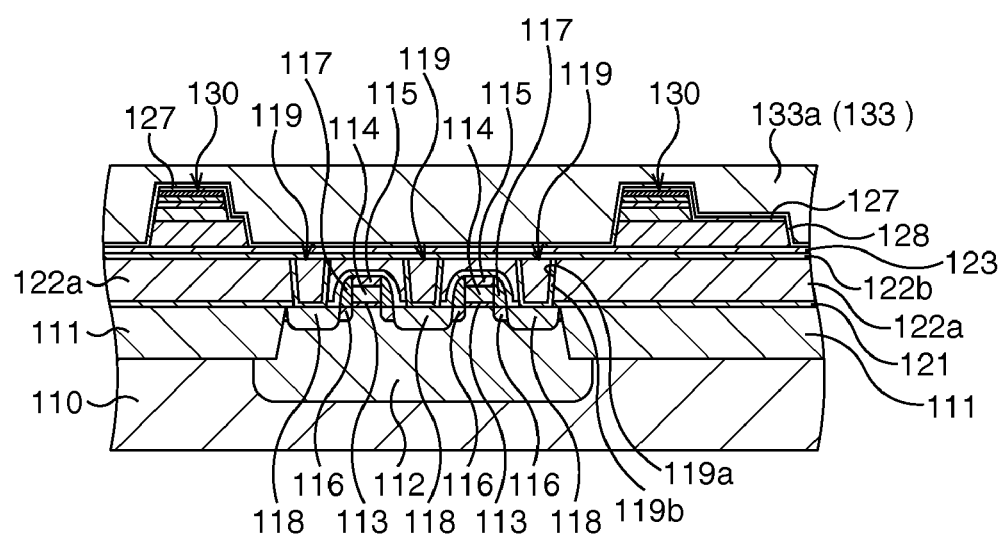
FIG. 7 is a schematic sectional view showing only the main process step, in the method for manufacturing the planar type FeRAM according to the modified example 1 of the first embodiment.
Figure 8:
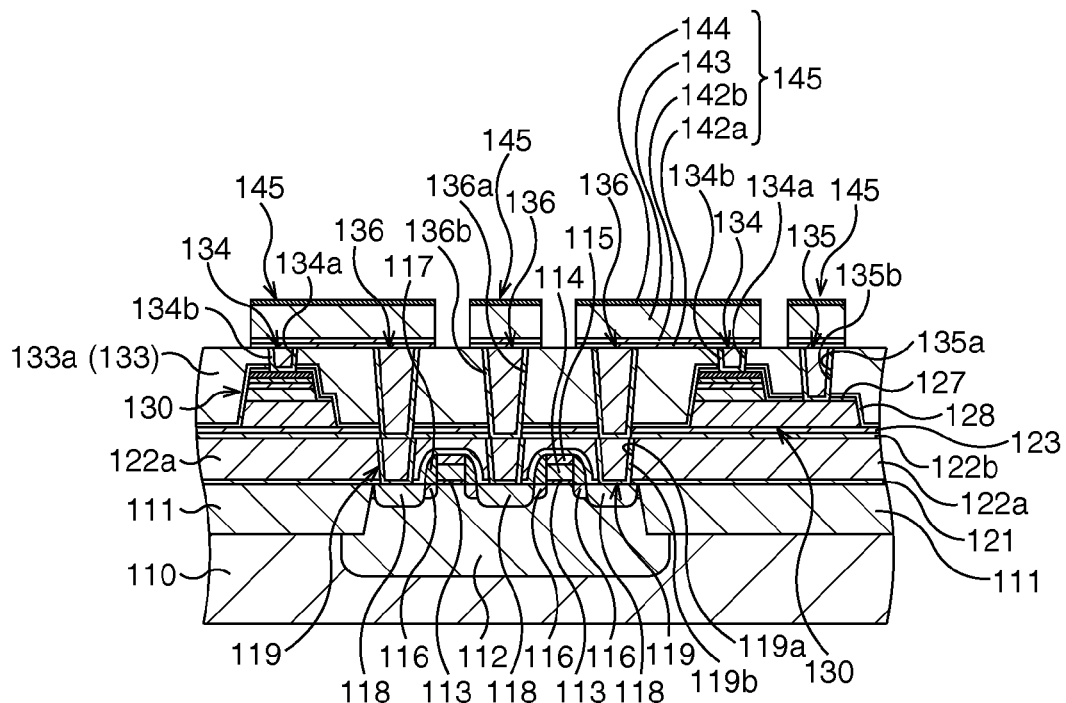
FIG. 8 is a schematic sectional view showing only the main process step, in the method for manufacturing the planar type FeRAM according to the modified example 1 of the first embodiment.

FIGS. 6 to 8 are schematic sectional views showing only main process steps in a manufacturing method of a planar type FeRAM according to a modified example 1 of the first embodiment.

First, as in the first embodiment, the modified example goes through the respective process steps in FIGS. 5A to 5J.

Subsequently, similarly to FIG. 5M, the first insulation film 133a and the second insulation film 133b are sequentially deposited on the entire surface as shown in FIG. 6. In this case, the first insulation film 133a is formed to a film thickness of about 700 nm, and the second insulation film 133b is formed to a film thickness of about 700 nm, respectively.

Subsequently, as shown in FIG. 7, surface flattening is performed by polishing the first and the second insulation films 133a and 133b, and the interlayer insulation film 133 is formed.

In detail, the interlayer insulation film 133 is formed by polishing the first and the second insulation films 133a and 133b until, for example, the film thickness becomes about 600 nm by CMP, up to the position shown by the broken line L in FIG. 6, for example. Here, polishing is performed so that the second insulation film 133b is wholly removed, and only the first insulation film 133a remains. At this time, the interlayer insulation film 133 which is formed by surface flattening and constituted of only the first insulation film 133a is formed.

In the interlayer insulation film 133, only the first insulation film 133a which has an extremely low moisture content and is inferior in surface flatness when solely adopted remains, but the ferroelectric capacitor structure 130 is sufficiently protected from entry of moisture/hydrogen and excellent surface flatness is obtained. In concrete, the in-plane film thickness distribution rate is 3% or less.

After the CMP, for example, plasma annealing treatment of $N_2O$ is applied for the purpose of dehydration and surface improvement of the interlayer insulation film 133.

Thereafter, as in the first embodiment, through each of the process steps in FIGS. 5M to 5Q, and various process steps of formation of the interlayer insulation films, the upper layer wirings and the like, the planar type FeRAM according to this example is completed as shown in FIG. 8.

As described above, according to this example, the interlayer insulation film 133 which prevents entry of moisture/hydrogen into the ferroelectric capacitor structure 130 as much as possible, but has extremely low in-plane film thickness distribution and extremely excellent surface flatness is formed, and the planar type FeRAM with high reliability with influence on the dielectric characteristics, variation in contact resistance and the like suppressed is realized.

Modified Example 2

Figure 9:
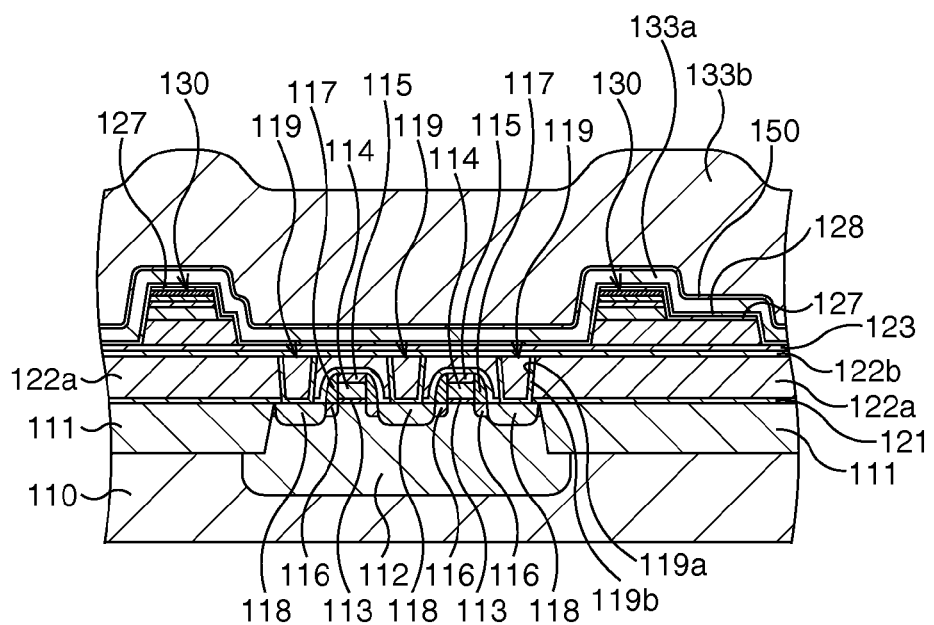
FIG. 9 is a schematic sectional view showing only the main process step, in the method for manufacturing the planar type FeRAM according to a modified example 2 of the first embodiment.
Figure 10:
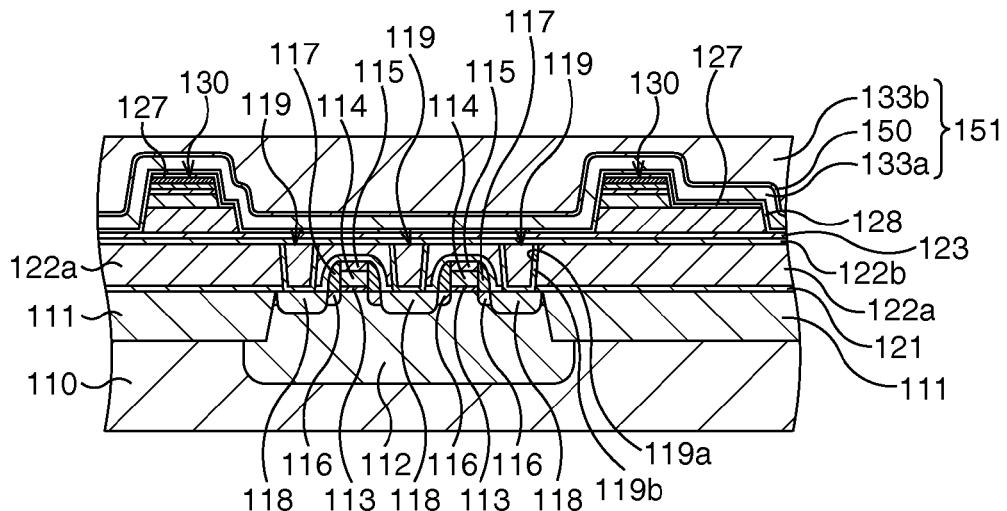
FIG. 10 is a schematic sectional view showing only the main process step, in the method for manufacturing the planar type FeRAM according to the modified example 2 of the first embodiment.
Figure 11:
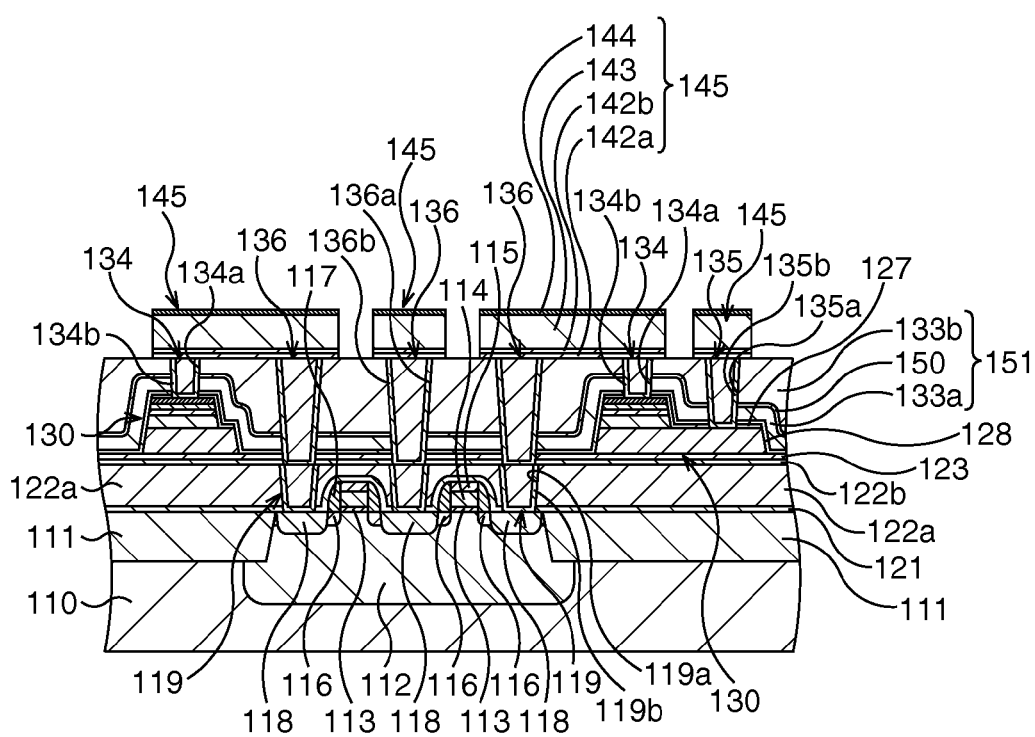
FIG. 11 is a schematic sectional view showing only the main process step, in the method for manufacturing the planar type FeRAM according to the modified example 2 of the first embodiment.

FIGS. 9 to 11 are schematic sectional views showing only main process steps in a manufacturing method of a planar type FeRAM according to a modified example 2 of the first embodiment.

First, as in the first embodiment, the modified example 2 goes through the respective process steps in FIGS. 5A to 5J.

Subsequently, as shown in FIG. 9, the first insulation film 133a and a thin hydrogen diffusion prevention film 150 covering the first insulation film 133a and the second insulation film 133b are sequentially deposited on the entire surface to cover the ferroelectric capacitor structure 2. The hydrogen diffusion prevention film 150 is formed by a sputtering method or a CVD method (for example, an MOCVD method) by using at least one kind of material selected from a group constituted of $Al_2O_3$ (alumina), Al nitrogen oxide, Ta oxide and Ti oxide, alumina in this case, as a material. Here, the first insulation film 133a is formed to a film thickness of about 300 nm, the hydrogen diffusion prevention film 150 is formed to a film thickness of about 50 nm, and the second insulation film 133b is formed to a film thickness of about 1100 nm, respectively.

Subsequently, as shown in FIG. 10, surface flattening is performed by polishing the first insulation film 133a, and an interlayer insulation film 151 is formed.

In detail, the interlayer insulation film 151 is formed by polishing it until the film thickness becomes, for example, about 700 nm by CMP, up to the position shown by the broken line L in FIG. 6, for example. Here, only the second insulation film 133b is polished. At this time, the surface of the second insulation film 133b is flattened, and the interlayer insulation film 151 made by sequentially stacking the first insulation film 133a, the hydrogen diffusion prevention film 150 and the second insulation film 133b is formed.

In the interlayer insulation film 151, the ferroelectric capacitor structure 130 is sufficiently protected from entry of moisture/hydrogen by the first insulation film 133a and the hydrogen diffusion prevention film which cover the ferroelectric capacitor structure 130, and excellent surface flatness is obtained by the second insulation film 133b. In concrete, the in-plane film thickness distribution rate becomes 3% or less.

After the CMP, plasma annealing treatment of $N_2O$, for example, is performed for the purpose of dehydration and surface improvement of the interlayer insulation film 151.

Thereafter, as in the first embodiment, through each of the process steps in FIGS. 5M to 5Q, and various process steps of formation of the interlayer insulation films, the upper layer wirings and the like, the planar type FeRAM according to this example is completed as shown in FIG. 11.

As described above, according to this example, the interlayer insulation film 151 which prevents entry of moisture/hydrogen into the ferroelectric capacitor structure 130 as much as possible, but has extremely low in-plane film thickness distribution and extremely excellent surface flatness is formed, and the planar type FeRAM with high reliability with influence on the dielectric characteristics, variation in contact resistance and the like suppressed is realized.

Second Embodiment

In this embodiment, a so-called stack type FeRAM in which continuity of a lower electrode of a ferroelectric capacitor structure is obtained below the lower electrode, and electrical continuity of an upper electrode is obtained above the upper electrode is shown as an example.

Here, a configuration of the stack type FeRAM is described with its manufacturing method. FIGS. 12A to 19 are schematic sectional views showing a manufacturing method of a stack type FeRAM according to this embodiment in sequence of the process steps.

Figure 12A:
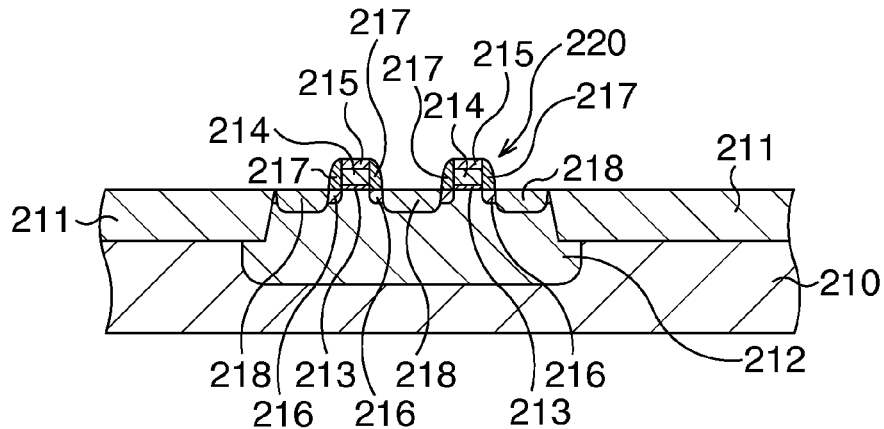
FIGS. 12A to 12C are schematic sectional views showing a method for manufacturing a stack type FeRAM according to a second embodiment in sequence of the process steps.

First, as shown in FIG. 12A, a MOS transistor 220 which functions as a selection transistor is formed on a silicon semiconductor substrate 210. In this case, with the MOS transistor 220, an nMOS transistor which is one of transistors of a CMOS transistor (not shown) is formed at the same time in a peripheral circuit region. A pMOS transistor which is the other transistor is formed before or after the nMOS transistor.

In detail, in a memory cell region, an element isolation structure 211 is formed on a surface layer of the silicon semiconductor substrate 210 by, for example, an STI (Shallow Trench Isolation) method, and an element active region is defined.

Next, an impurity, in this case, boron ($B^+$) is ion-implanted into the element active region under the conditions of, for example, a dose amount of $3.0\times10^{13}/cm^2$ and acceleration energy of 300 keV, and thereby, a well 212 is formed.

Next, a thin gate insulation film 213 of a film thickness of about 3.0 nm is formed in the element active region by thermal oxidation or the like, then, a polycrystalline silicon film of a film thickness of about 180 nm and, for example, a silicon nitride film of a film thickness of about 29 nm are deposited on the gate insulation film 213 by a CVD method, and the silicon nitride film, the polycrystalline silicon film and the gate insulation film 213 are processed into electrode shapes by lithography and the subsequent dry etching, whereby gate electrodes 214 are pattern-formed on the gate insulation film 213. At this time, cap films 215 constituted of a silicon nitride film are pattern-formed on the gate electrodes 214 at the same time.

Next, with the cap films 215 as masks, an impurity, in this case, arsenic ($As^+$) is ion-implanted into the element active region under the conditions of, for example, a dose amount of $5.0\times10^{14}/cm^2$, and acceleration energy of 10 keV, and so-called LDD regions 216 are formed.

Next, for example, a silicon oxide film is deposited on the entire surface by a CVD method, and by performing so-called etchback of the silicon oxide film, side wall insulation films 217 are formed by leaving the silicon oxide film only on the side surfaces of the gate electrodes 214 and the cap films 215.

Next, with the cap films 215 and the side wall insulation films 217 as masks, an impurity, in this case, phosphorus ($P^+$) is ion-implanted into the element active region under the condition that the impurity concentration becomes higher than the LDD regions 216, and source/drain regions 218 which are overlapped on the LDD regions 216 are formed, whereby the MOS transistor 220 is completed.

Figure 12B:
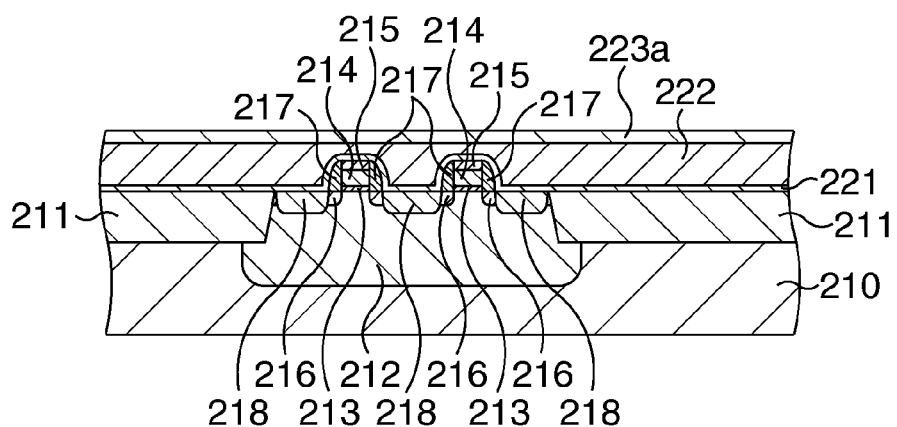

Subsequently, as shown in FIG. 12B, a protection film 221 of the MOS transistor 220, an interlayer insulation film 222 and an upper insulation film 223a are sequentially formed on the entire surface.

In detail, the protection film 221, the interlayer insulation film 222 and the upper insulation film 223a are sequentially formed so as to cover the MOS transistor 220. In this case, as the protection film 221, a silicon oxide film is used as a material, and is deposited to a film thickness of about 20 nm by a CVD method. As the interlayer insulation film 222, a stacked structure in which, for example, a plasma SiO film (film thickness of about 20 nm), a plasma SiN film (film thickness of about 80 nm) and a plasma TEOS film (film thickness of about 1000 nm) are sequentially deposited is formed, and after stacking them, the stacked structure is polished by CMP until the film thickness becomes about 700 nm. As the upper insulation film 223a, a silicon nitride film is used as a material, and is deposited to a film thickness of about 100 nm by a CVD method.

Figure 12C:
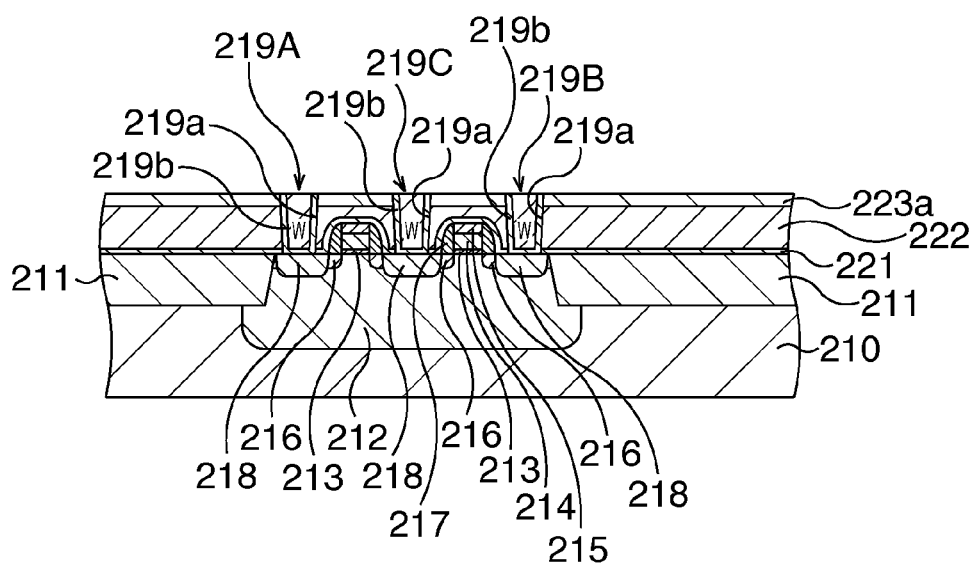

Subsequently, as shown in FIG. 12C, conductive plugs 129A, 219B and 219C which are connected to the source/drain regions 218 of the transistor structure 220 are formed.

In detail, with each of the source/drain regions 218 as an etching stopper, the upper insulation film 223a, the interlayer insulation film 222 and the protection film 221 are processed by lithography and the subsequent dry etching until a part of the front surface of each of the source/drain regions 218 is exposed. Thereby, via holes 219a each with a diameter of about 0.3 μm, for example, is formed.

Next, for example, a Ti film and a TiN film are sequentially deposited to a film thickness of about 20 nm and a film thickness of about 50 nm by a sputtering method so as to cover the wall surface of each of the via holes 219a, and a base film (glue film) 219b is formed. Then, for example, a W film is deposited to fill each of the via holes 219a via the glue film 219b by a CVD method. Thereafter, the W films and the glue films 219b are polished with the upper insulation film 223a as a stopper by CMP, and the conductive plugs 219A, 219B and 219C in which the inside of each of the via holes 219a is filled with the W via the glue film 219b are formed at the same time. After the CMP, plasma annealing treatment of $N_2O$, for example, is performed.

Figure 13A:
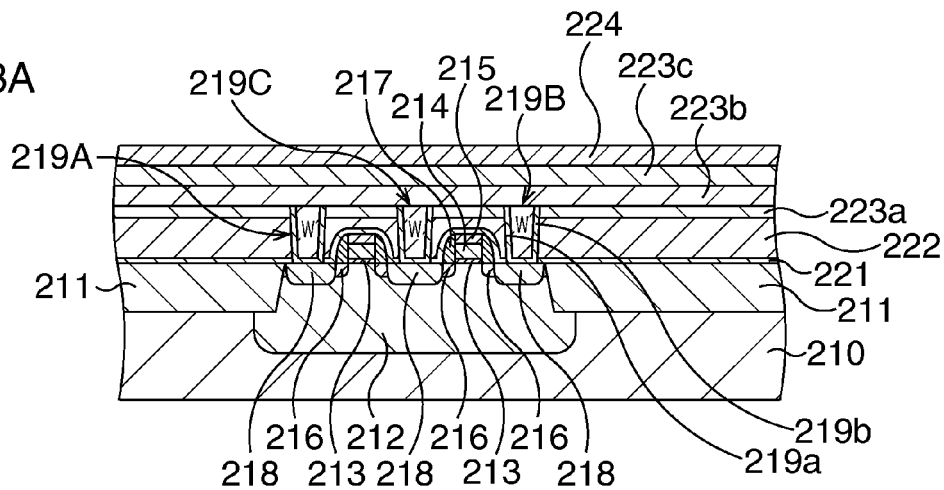
FIGS. 13A to 13C are schematic sectional views showing the method for manufacturing the stack type FeRAM according to the second embodiment in sequence of the process steps, continuing from FIG. 12C.

Subsequently, as shown in FIG. 13A, an orientation property improving film 223b, an oxygen barrier film 223c and a lower electrode film 224 are sequentially formed on the entire surface.

In detail, in order to improve the orientation property of the capacitor film of a ferroelectric capacitor structure which will be described later, for example, Ti is first deposited to a film thickness of about 20 nm. Since titanium has the property of strong self orientation, a titanium film favorable in crystallinity is formed on the conductive plugs 219A, 219B and 219C and on the upper insulation film 223a. Thereafter, the Ti film is nitrided to be TiN by rapid annealing (RTA) treatment under an $N_2$ atmosphere, and the conductive orientation property improving film 223b is formed. The conditions of the RTA treatment are, for example, the substrate temperature of 650° C., the nitrogen flow rate of 10 slm (standard liter/min, $1.013 \times 10^5$ Pa, 0° C.), and the treatment time is about 120 seconds. Since the titanium film before being nitrided is favorable in crystallinity, the crystallinity of the orientation property improving film 223b which is the TiN film made by nitriding the titanium film is also favorable.

Next, TiAlN is deposited to a film thickness of about 100 nm on the orientation property improving film 223b by, for example, a sputtering method, and the conductive oxygen barrier film 223c is formed.

Next, Ir is deposited to a film thickness of about 100 nm, for example, by a sputtering method, and a lower electrode film 224 is formed. The deposition temperature of the Ir film is preferably as high as possible in order to enhance crystallinity. Therefore, the surface of the lower electrode film 224 is easily oxidized when the silicon semiconductor substrate 210 is taken out into the atmosphere after deposition, due to deposition of the lower electrode film 224 at a high deposition temperature, for example, at 500° C. As the lower electrode film 224, instead of Ir, noble metals other than Pt, for example, ruthenium (Ru) may be deposited, of the metals having the property of keeping conductivity even when they themselves are oxidized. Even when the lower electrode film 224 is formed of Ru, its surface is easily oxidized by contacting external air after deposition, as in the above description.

Figure 13B:
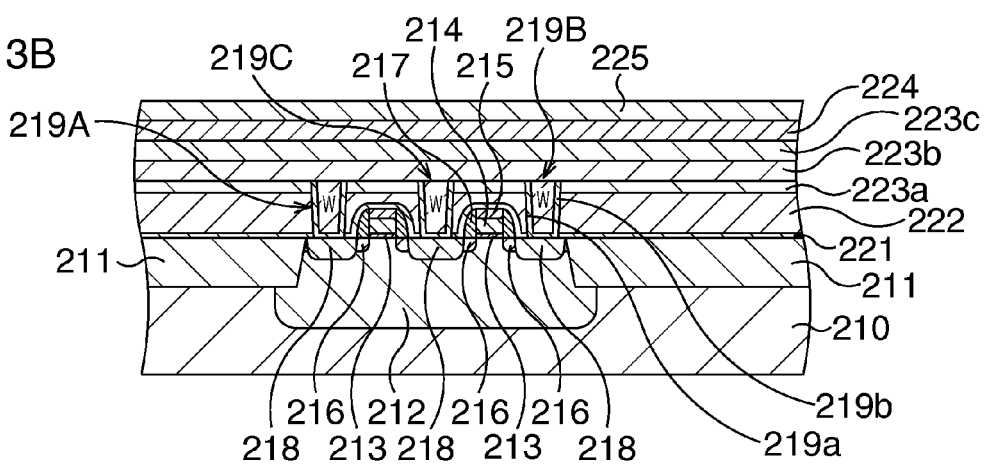

Subsequently, as shown in FIG. 13B, a capacitor film 225 is formed on the lower electrode film 224 on the entire surface.

In detail, a PZT film of a first layer is first deposited to a film thickness of about 5 nm by an MOCVD method, then, a PZT film of a second layer is further deposited to a film thickness of about 115 nm thereon by an MOCVD method, and the capacitor film 225 of an entire thickness of 120 nm is formed. For convenience of illustration, the capacitor film 225 is shown as a single-layer structure. As the deposition conditions of each of the PZT films, the substrate temperature is, for example, 620° C., and the pressure is about $6.67 \times 10^2$ Pa. As the material of the ferroelectric film 225, $Pb_{1-x}La_xZr_{1-y}Ti_yO_3$ (0<x<1, 0<y<1), $SrBi_2(Ta_xNb_{1-x})_2O_9$ (0<x<1), $Bi_4Ti_2O_{12}$ and the like may be used instead of PZT.

In this case, the PZT films on the first layer and the second layer have the same compositions. However, the first layer is deposited with oxygen partial pressure lowered. This is because crystallinity of the PZT film itself is more favorable when it is deposited with low oxygen partial pressure. However, if the second layer is also deposited with low oxygen partial pressure, oxygen deficiency in the PZT film increases, and leak current increases. Therefore, in this case, the two-stage growth method in which the deposition conditions of the first layer and the second layer differ is adopted.

Figure 13C:
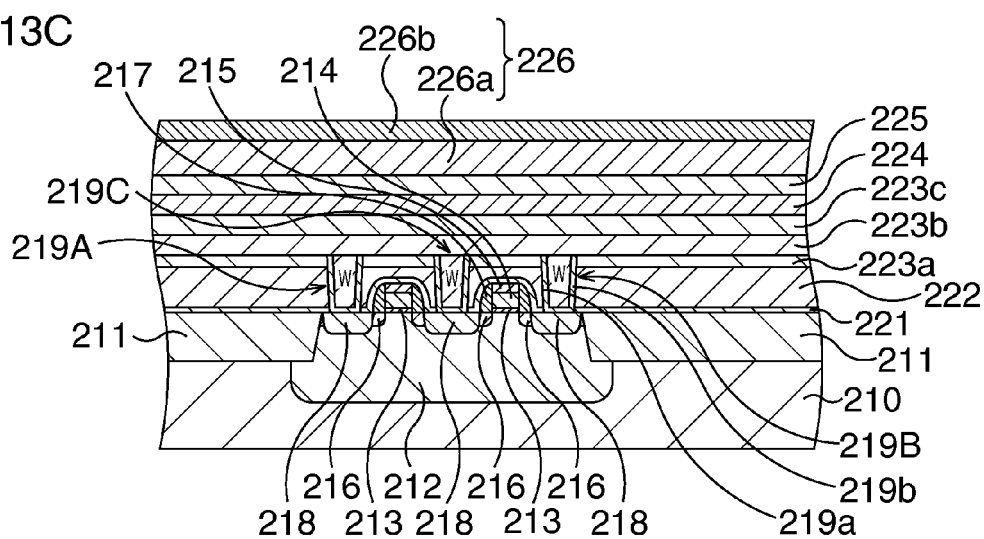

Subsequently, as shown in FIG. 13C, an iridium oxide film 226a and an Ir film 226b which are constituents of an upper electrode film 226 are sequentially formed on the capacitor film 225 on the entire surface.

In detail, by a sputtering method, an iridium oxide is first deposited to a film thickness of about 150 nm to form the iridium oxide film 226a.

Next, by a sputter method, Ir is deposited to a film thickness of about 100 nm on the iridium oxide film 226a to form the Ir film 226b. The upper electrode film 226 is constituted of the iridium oxide film 226a and the Ir film 226b. In the upper electrode layer 226, Ir, Ru, $RuO_2$, $SrRuO_3$ and other conductive oxides and a stacked structure of them may be adopted in place of the iridium oxide film 226a. Formation of the Pt film 226b can be omitted.

Figure 14A:
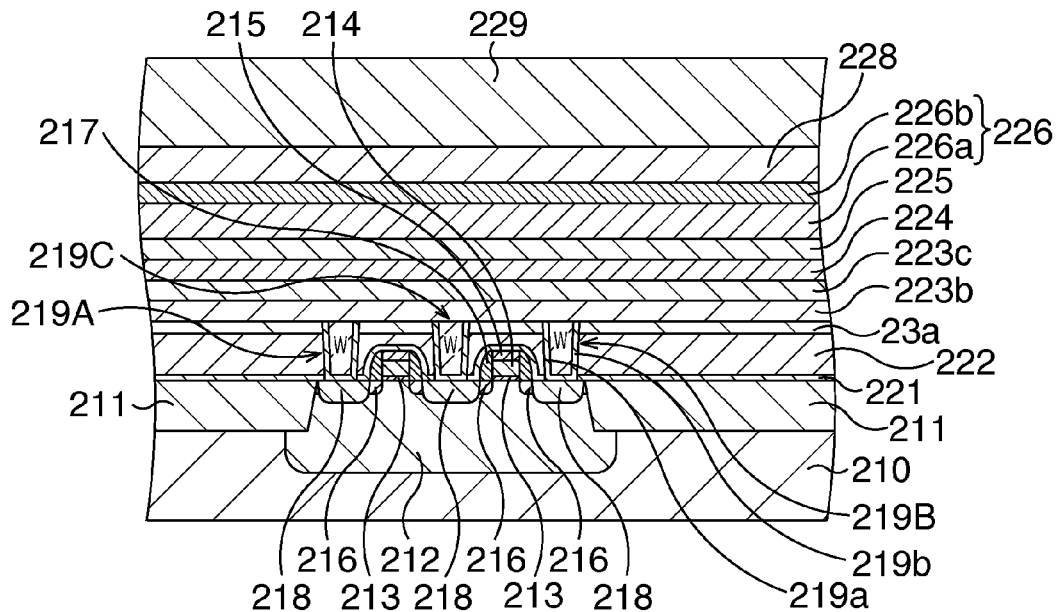
FIGS. 14A and 14B are schematic sectional views showing the method for manufacturing the stack type FeRAM according to the second embodiment in sequence of the process steps, continuing from FIG. 13C.

Subsequently, as shown in FIG. 14A, a TiN film 228 and a silicon oxide film 229 are formed on the entire surface.

In detail, the TiN film 228 is formed by being deposited on the upper electrode film 226 to a film thickness of about 200 nm by a sputtering method or the like. The silicon oxide film 229 is formed by being deposited on the TiN film 228 to a film thickness of about 1000 nm by a CVD method using, for example, TEOS. In this case, an HDP film may be formed instead of the TEOS film. It is preferable to form a silicon nitride film further on the silicon oxide film 229.

Figure 14B:
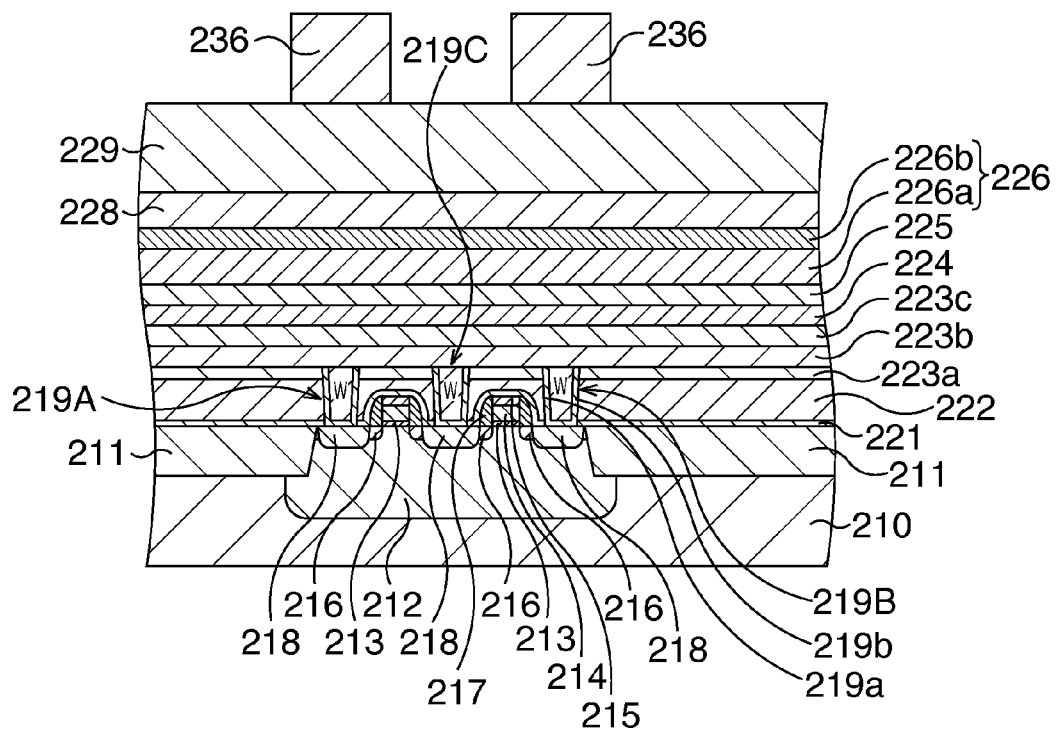

Subsequently, as shown in FIG. 14B, resist masks 236 are formed.

In detail, a resist is coated on the silicon oxide film 229, the resist is processed into electrode shapes by lithography, and each of the resist masks 236 is formed. In this case, one of the resist masks 236 is formed at the position matched with the conductive plug 219A below it, whereas the other resist mask 236 is formed at the position matched with the conductive plug 219B below it.

Figure 15A:
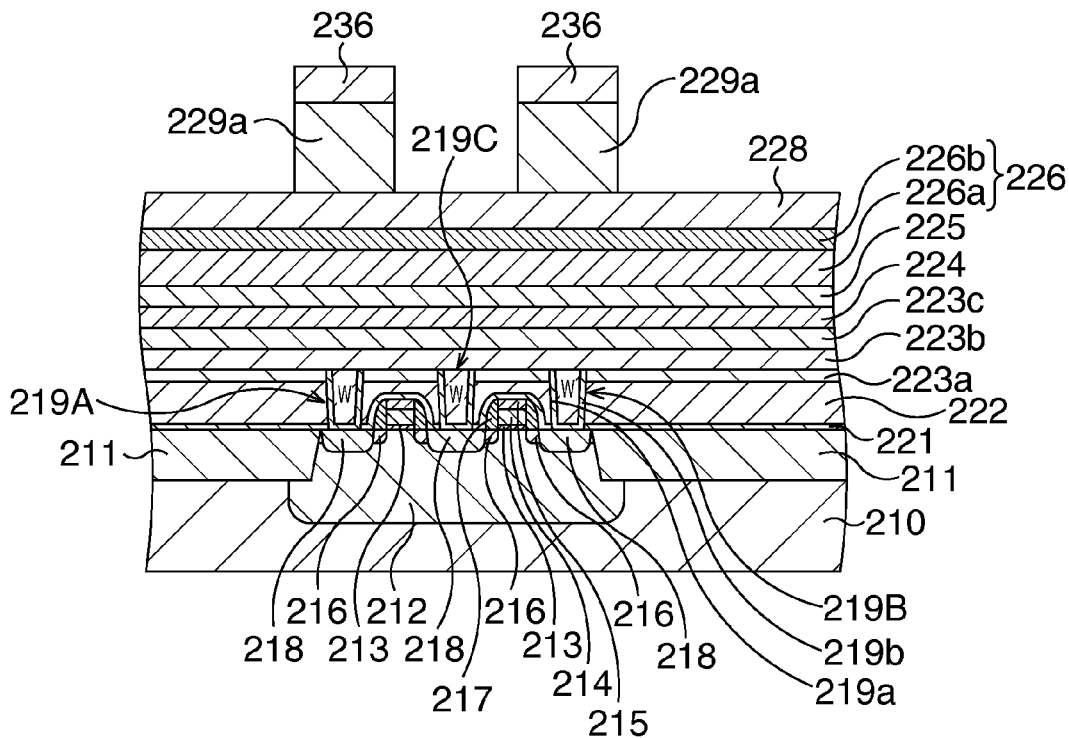
FIGS. 15A and 15B are schematic sectional views showing the method for manufacturing the stack type FeRAM according to the second embodiment in sequence of the process steps, continuing from FIG. 14B.

Subsequently, as shown in FIG. 15A, a silicon oxide film 229 is processed.

In detail, the silicon oxide film 229 is dry-etched with the resist masks 236 as masks. At this time, the silicon oxide film 229 is patterned along the electrode shapes of the resist masks 236, and hard masks 229a are formed. The resist masks 236 are etched and decrease in thickness.

Figure 15B:
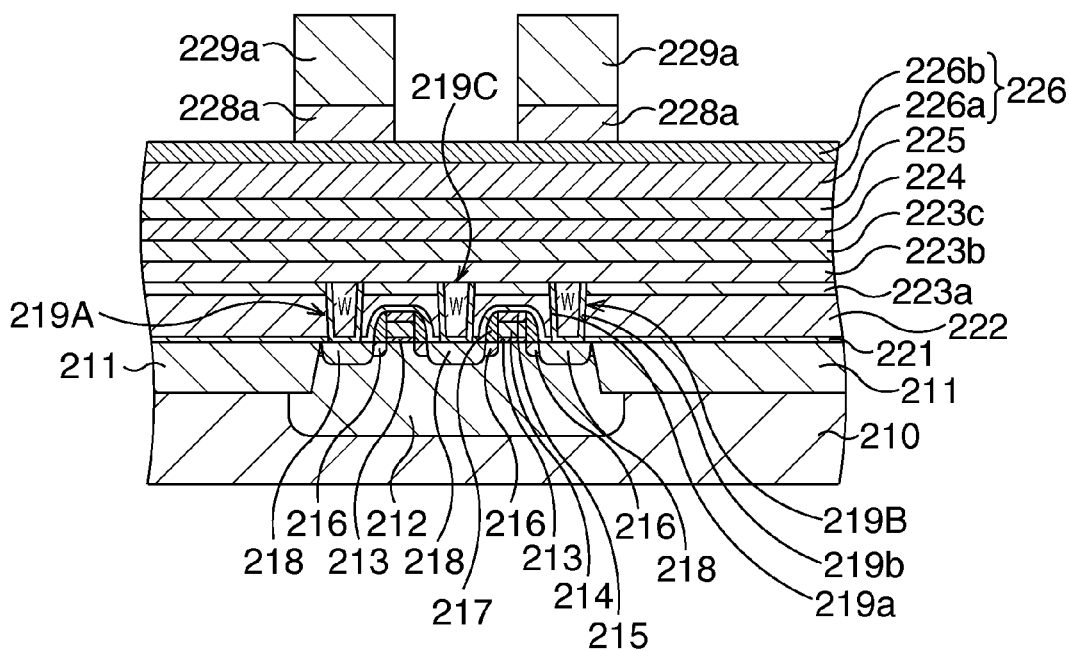

Subsequently, as shown in FIG. 15B, the TiN film 228 is processed.

In detail, with the resist masks 236 and the hard masks 229a as masks, the TiN film 228 is dry-etched. At this time, the TiN film 228 is patterned along the electrode shapes of the hard masks 229a, and hard masks 228a are formed. The resist masks 236 themselves are etched during the etching and become thin. Thereafter, the resist masks 236 are removed by ashing treatment or the like.

Figure 16A:
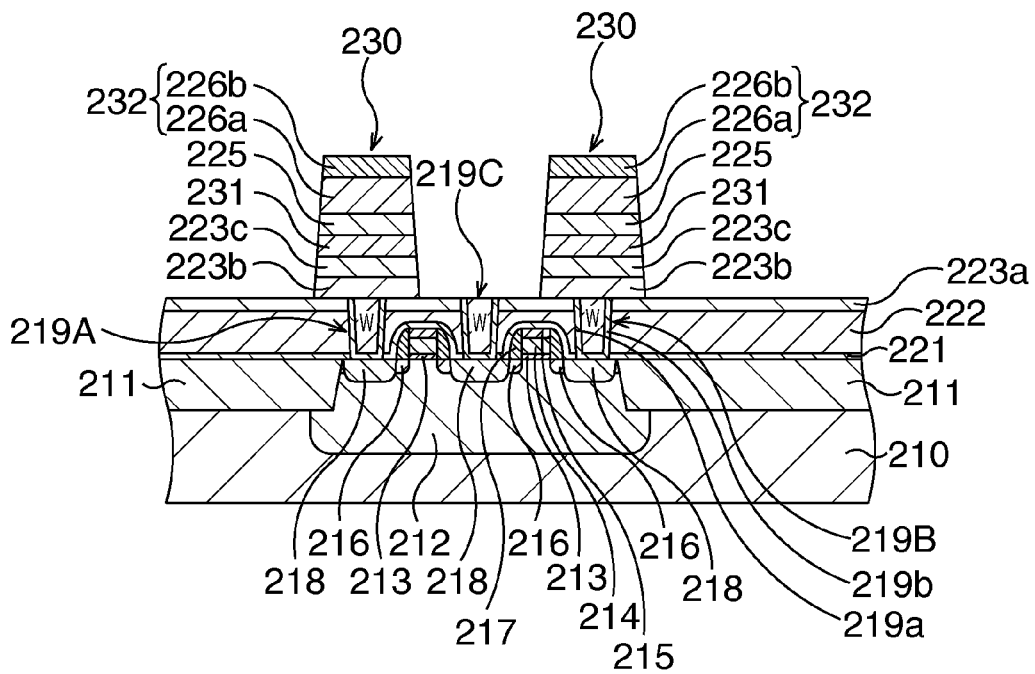
FIGS. 16A and 16B are schematic sectional views showing the method for manufacturing the stack type FeRAM according to the second embodiment in sequence of the process steps, continuing from FIG. 15B.

Subsequently, the upper electrode film 226, the capacitor film 225 and the lower electrode film 224 are processed collectively by etching, and thereafter, the oxygen barrier film 223c and the orientation property improving film 223b are processed by etching. Thereby, the ferroelectric capacitor 230 is completed as shown in FIG. 16A.

In detail, with the hard masks 228a and 229a as masks, and with the oxygen barrier film 223c as an etching stopper, the upper electrode film 226, the capacitor film 225 and the lower electrode film 224 are first collectively dry-etched (collective etching). Then, with the hard mask 228a and the hard mask 229a as masks similarly, and with the upper insulation film 223a as an etching stopper, the oxygen barrier film 223c and the orientation property improving film 223b are dry-etched. By dry-etching of them, the upper electrode film 226, the capacitor film 225, the lower electrode film 224, the oxygen barrier film 223c and the orientation property improving film 223b are patterned along the electrode shapes of the hard masks 228a. The hard masks 229a themselves are etched during the etching and become thin.

Thereafter, the hard masks 229a constituted of the silicon oxide film are etched and removed by whole-surface dry etching (etchback).

Next, the hard masks 228a constituted of TiN are removed by wet etching. At this time, the capacitor films 225 and the upper electrodes 232 are sequentially stacked on the lower electrodes 231, and each of the ferroelectric capacitors 230 in which the lower electrode 231 and the upper electrode 232 are capacitively coupled via the capacitor film 225 is completed.

Here, in the memory cell region, in the ferroelectric capacitor 230 at the left side in FIG. 16A, the lower electrode 231 is connected to the conductive plug 219A via the conductive orientation property improving film 223b and oxygen barrier film 223c, and the source/drain 218 and the lower electrode 231 are electrically connected via the conductive plug 219A, the orientation property improving film 223b and the oxygen barrier film 223c. Meanwhile, in the ferroelectric capacitor 230 at the right side in FIG. 16A, the lower electrode 231 is connected to the conductive plug 219B via the conductive orientation property improving film 223b and oxygen barrier film 223c, and the source/drain 218 and the lower electrode 231 are electrically connected via the conductive plug 219B, the orientation property improving film 223b and the oxygen barrier film 223c.

Figure 16B:
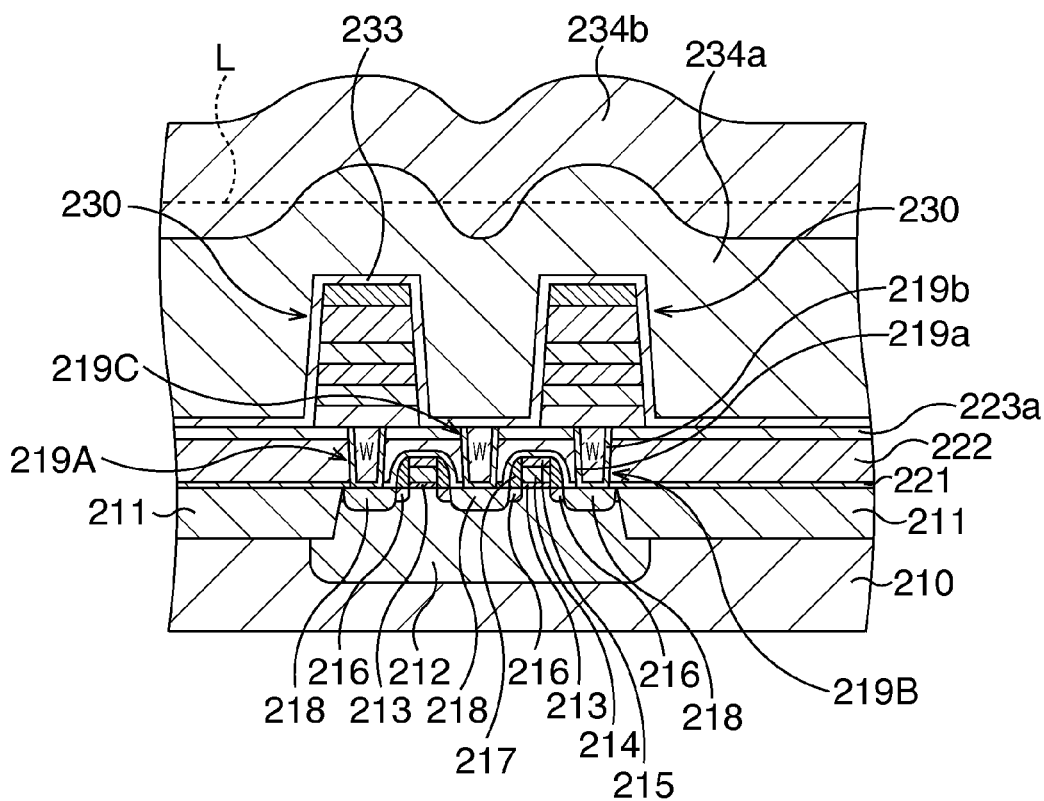

Subsequently, as shown in FIG. 16B, a hydrogen diffusion prevention film 233, a first insulation film 234a and a second insulation film 234b are sequentially deposited on the entire surface.

In detail, alumina ($Al_2O_3$) is used as a material, and is deposited to a film thickness of about 20 nm to 50 nm, for example, about 40 nm by an atomic layer deposition method (ALD: Atomic Layer Deposition) to cover the entire surface of the ferroelectric capacitor 230, and the hydrogen diffusion prevention film 233 is formed. Thereafter, the protection film 233 is subjected to annealing treatment.

Next, the first insulation film 234a and the second insulation film 234b are sequentially deposited so as to cover the ferroelectric capacitor 230 via the protection film 233. The first insulation film 234a is formed to be in the state with an extremely low moisture content in order to protect the ferroelectric capacitor 230 from entry of moisture/hydrogen. On the other hand, the second insulation film 234b is formed to be in the state with excellent surface flatness, accordingly, in the state lower in low moisture content than the first insulation film 234a. In concrete, the first insulation film 234a is formed from an insulating material with an in-plane film thickness distribution rate of about 5% or less, and the second insulation film 234b is formed from an insulating material with an in-plane film thickness distribution rate of about 2% or less.

From the above described requirement, the first and second insulation films 234a and 234b are formed as silicon oxide films by a plasma CVD method using, for example, TEOS. In this case, the pressure in the source gas is regulated so as to be lower at the time of deposition of the second insulation film 234b than at the time of deposition of the first insulation film 234a. Here, instead of the pressure condition, or with the pressure condition, the oxygen amount (oxygen flow rate) in the source gas may be regulated so as to be lower at the time of deposition of the second insulation film 234b than at the time of deposition of the first insulation film 234a. In concrete, plasma CVD is carried out under the conditions of growth temperature: 390° C., pressure: $1.2\times10^3$ [Pa] (9 [Torr]), $O_2$ flow rate: 2980 [sccm], TEOS: 690 [mgm], He: 720 [sccm], and RF power: 700 [W] at the time of deposition of the first insulation film 234a, and under the conditions of growth temperature: 390° C., pressure: $6.67\times10^2$ [Pa] (5 [Torr]), $O_2$ flow rate: 2100 [sccm], TEOS: 690 [mgm], He: 720 [sccm], and RF power: 700 [W] at the time of deposition of the second insulation film 234b. Thereby, for example, the first insulation film 234a is formed to a film thickness of about 500 nm, and the second insulation film 234b is formed to a film thickness of about 900 nm. In this case, the first and the second insulation films 234a and 234b are formed to be higher in the first portions located above the ferroelectric capacitor structures 230 than in the second portions other than the first portions, since the ferroelectric capacitor structures 230 exist.

Figure 17A:
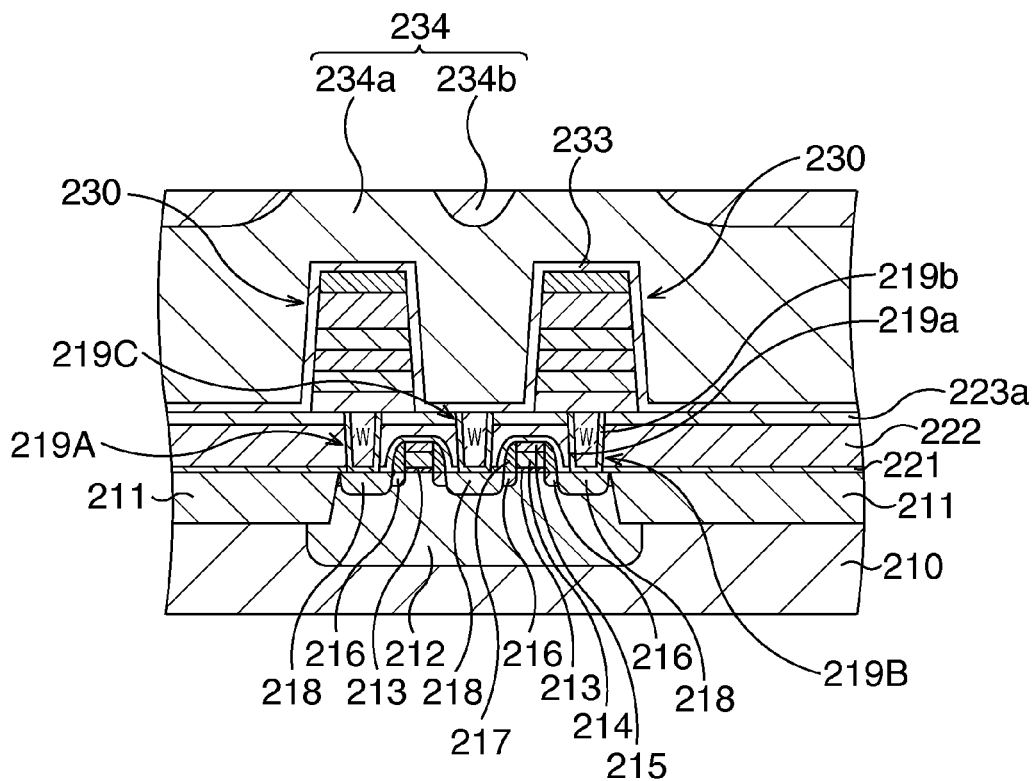
FIGS. 17A and 17B are schematic sectional views showing the method for manufacturing the stack type FeRAM according to the second embodiment in sequence of the process steps, continuing from FIG. 16B.

Subsequently, as shown in FIG. 17A, surface flattening is performed by polishing the first and the second insulation films 234a and 234b, and an interlayer insulation film 234 is formed.

In detail, the interlayer insulation film 234 is formed by polishing the first and the second insulation films 234a and 234b until the film thickness becomes about 700 nm, for example, by CMP, up to the position shown by the broken line L in FIG. 16B, for example. In this case, polishing is performed until directly above the ferroelectric capacitor structure 230, the second insulation film 234b is wholly removed, and the surface of the first insulation film 234a is exposed to some extent. The second insulation film 234b remains on the second portions of the first insulation film 234a. At this time, the top surfaces of the first portions in the first insulation film 234a and the top surface of the second insulation film 234b are flattened, and the interlayer insulation film 234 constituted of the first insulation film 234a, and the second insulation film 234b remaining on the second portions of the first insulation film 234a is formed.

In the interlayer insulation film 234, the ferroelectric capacitor structure 230 is sufficiently protected from entry of moisture/hydrogen by the first insulation film 234a covering the ferroelectric capacitor structure 230, and excellent surface flatness can be obtained by the second insulation film 234b. In concrete, the in-plane film thickness distribution rate becomes 3% or less.

After the CMP, for the purpose of dehydration and surface improvement of the interlayer insulation film 234, plasma annealing treatment of, for example, $N_2O$ is performed.

Figure 17B:
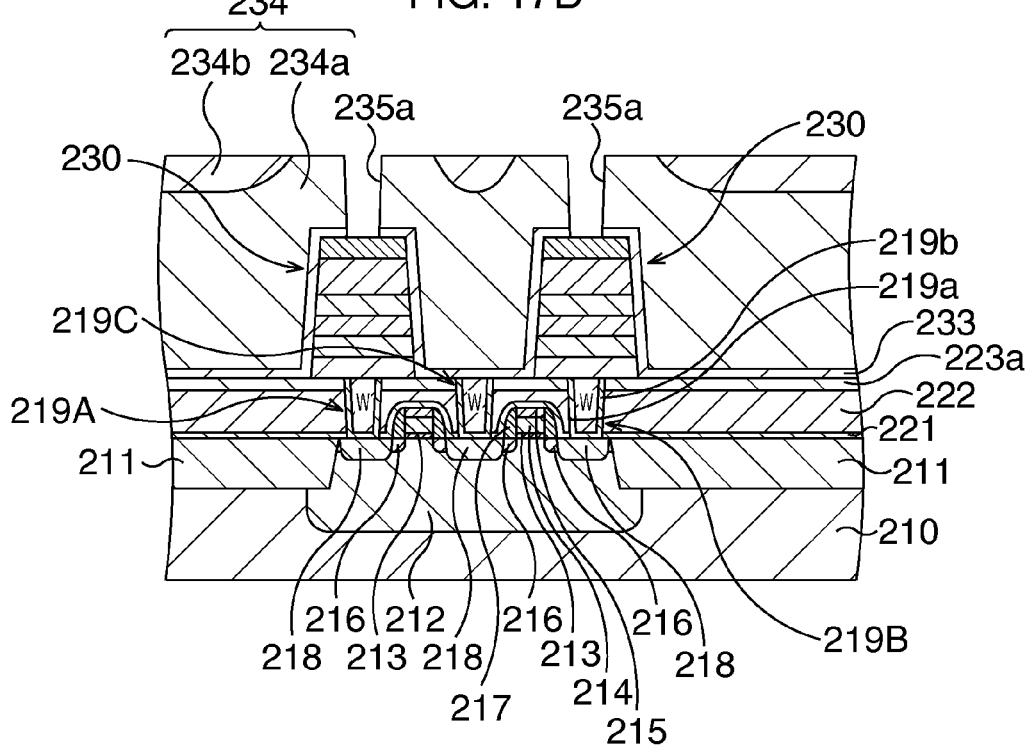

Subsequently, as shown in FIG. 17B, each of via holes 235a to the upper electrode 232 of the ferroelectric capacitor structure 230 is formed.

In detail, the interlayer insulation film 234 and the hydrogen diffusion prevention film 233 are patterned by lithography and the subsequent dry etching, and the via holes 235a in which parts of the surfaces of the respective upper electrodes 232 are exposed are formed.

Figure 18A:
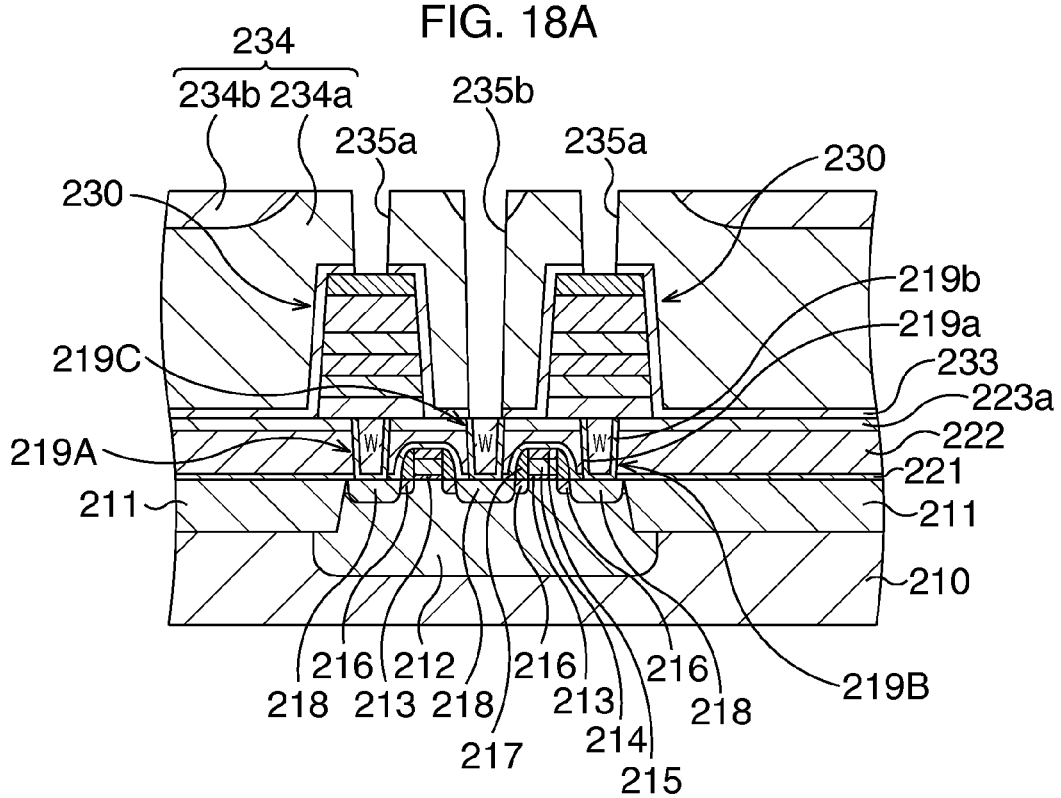
FIGS. 18A and 18B are schematic sectional views showing the method for manufacturing the stack type FeRAM according to the second embodiment in sequence of the process steps, continuing from FIG. 17B.

Subsequently, as shown in FIG. 18A, a via hole 235b to the conductive plug 219C is formed.

In detail, in the memory cell region, the interlayer insulation film 234 and the protection film 233 are patterned by lithograph and the subsequent dry etching, and the via hole 235b in which a part of the surface of the conductive plug 219C is formed.

Figure 18B:
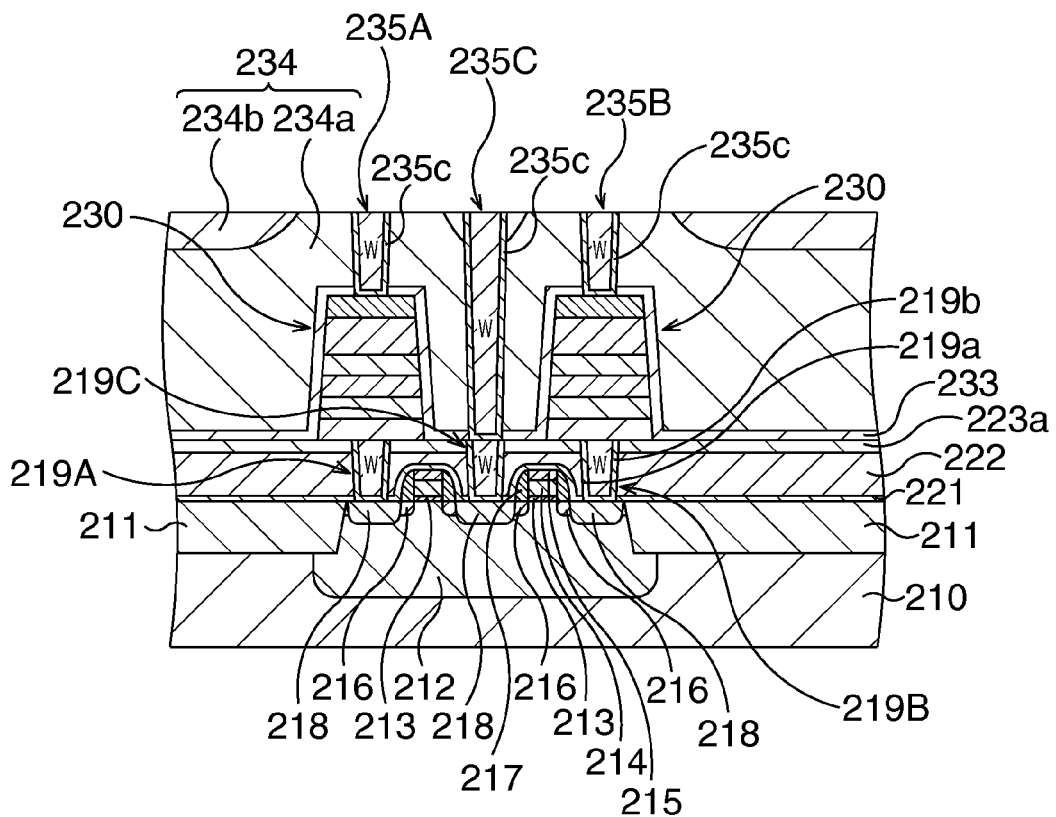

Subsequently, as shown in FIG. 18B, conductive plugs 235A, 235B, 235D and 235E which are connected to the upper electrodes 232 of the ferroelectric capacitors 230, and a conductive plug 235C which is connected to the conductive plug 219C are formed at the same time.

In detail, base films (glue films) 235c are first formed to cover the wall surfaces of the via holes 235a and 235b, and thereafter, W films are formed to fill the via holes 235a and 235b via the glue films 235c by a CVC method. Then, with the interlayer insulation film 234 as a stopper, for example, the W films and the glue films 235c are polished by CMP, and the conductive plugs 235A, 235B and 235C in which the insides of the via holes 235a and 235b are filled with the W via the glue films 235c are formed. After the CMP, plasma annealing treatment of $N_2O$, for example, is performed.

Figure 19:
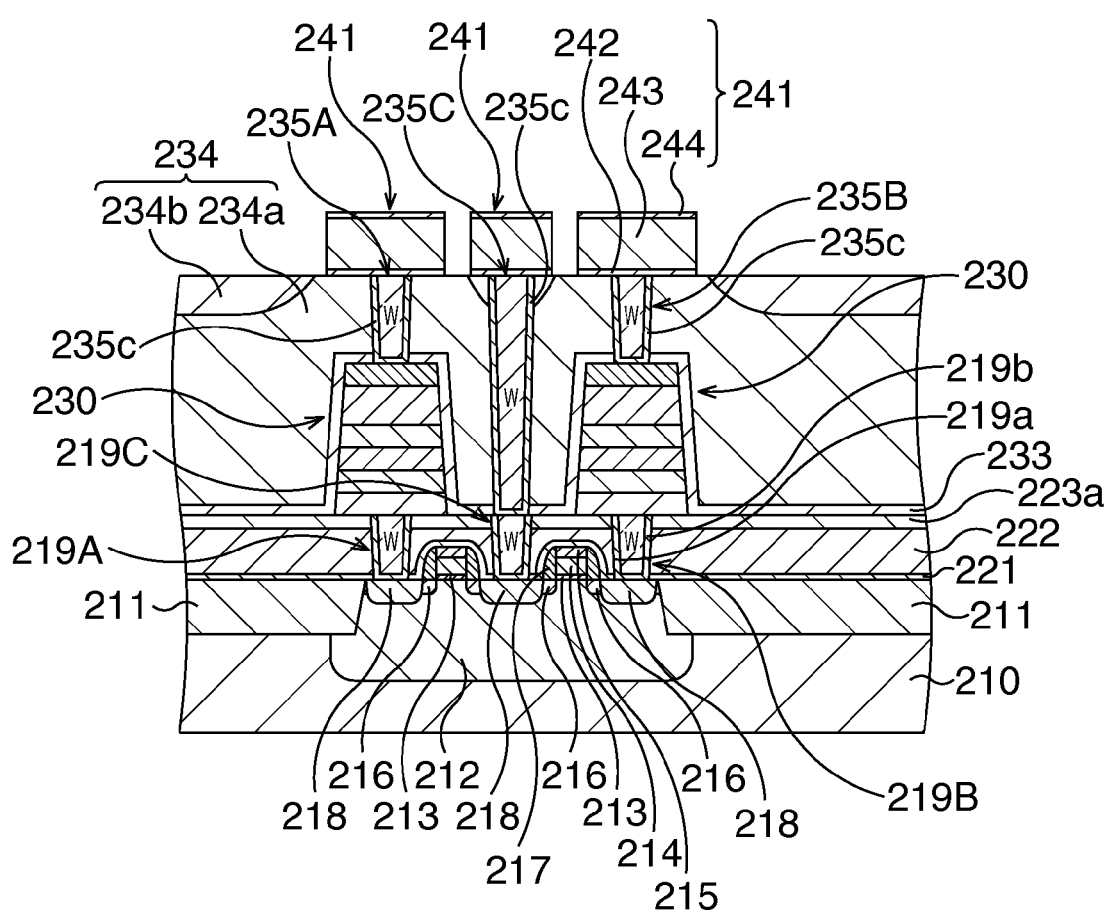
FIG. 19 is a schematic sectional view showing the method for manufacturing the stack type FeRAM according to the second embodiment in sequence of the process step, continuing from FIG. 18B.

Subsequently, as shown in FIG. 19, respective wirings 241 which are connected to the conductive plugs 235A, 235B and 235C are formed.

In detail, first, a barrier metal film 242, a wiring film 243 and a barrier metal film 244 are deposited on the entire surface on the interlayer insulation film 234 by a sputtering method or the like. As the barrier metal film 242, for example, a Ti film of a film thickness of about 5 nm and a TiN film of a film thickness of about 150 nm are deposited to be stacked by a sputtering method. As the wiring film 243, for example, an Al alloy film (Al—Cu film in this case) is deposited to a film thickness of about 350 nm. As the barrier metal film 244, for example, a Ti film of a film thickness of about 5 nm and a TiN film of a film thickness of about 150 nm are deposited to be stacked by a sputtering method.

Next, after, for example, an SiON film or an anti-reflection film (not shown) is deposited as an anti-reflection film, the anti-reflection film, the barrier metal film 244, the wiring film 243 and the barrier metal film 242 are processed into the wiring shapes by lithography and the subsequent dry etching, and the respective wirings 241 which are connected to the conductive plugs 235A, 235B and 235C are pattern-formed. As the wiring film 243, a Cu film (or a Cu alloy film) may be formed by utilizing a so-called damascene method or the like instead of forming the Al alloy film, and a Cu wiring may be formed as the wiring 241.

Here, in FIG. 19, the lower electrodes 231 are connected to the source/drain regions 218 via the conductive plugs 219A and 219B, and the upper electrodes 232 are connected to the wirings 241 via the conductive plugs 235A and 235B so that the ferroelectric capacitors 230 function as memory cell capacitors.

Thereafter, the stack type FeRAM according to this embodiment is completed through the various process steps of forming interlayer insulation films, additional upper layer wirings and the like.

As described above, according to this embodiment, the interlayer insulation film 234 which prevents entry of moisture/hydrogen into the ferroelectric capacitor structure 230 as much as possible, but has extremely excellent surface flatness with extremely low in-plane film thickness distribution is formed, and the stack type FeRAM with high reliability with influence on the dielectric characteristics, variation in contact resistance and the like suppressed is realized.

In this embodiment, the case in which the film in the simple planar shape is formed as the ferroelectric film 225 is shown as an example, but the present invention can be applied to a so-called three-dimensional capacitor in which a dielectric film which is not in a simple planar shape is formed.

MODIFIED EXAMPLES

Various modified examples of the second embodiment will be described hereinafter.

In these modified examples, a stack type FeRAM is shown as an example as in the second embodiment, and these modified examples differ from the second embodiment in the respect that the structures of the interlayer insulation films 234 covering the ferroelectric capacitor structures 230 differ from that of the second embodiment.

Modified Example 1

Figure 20:
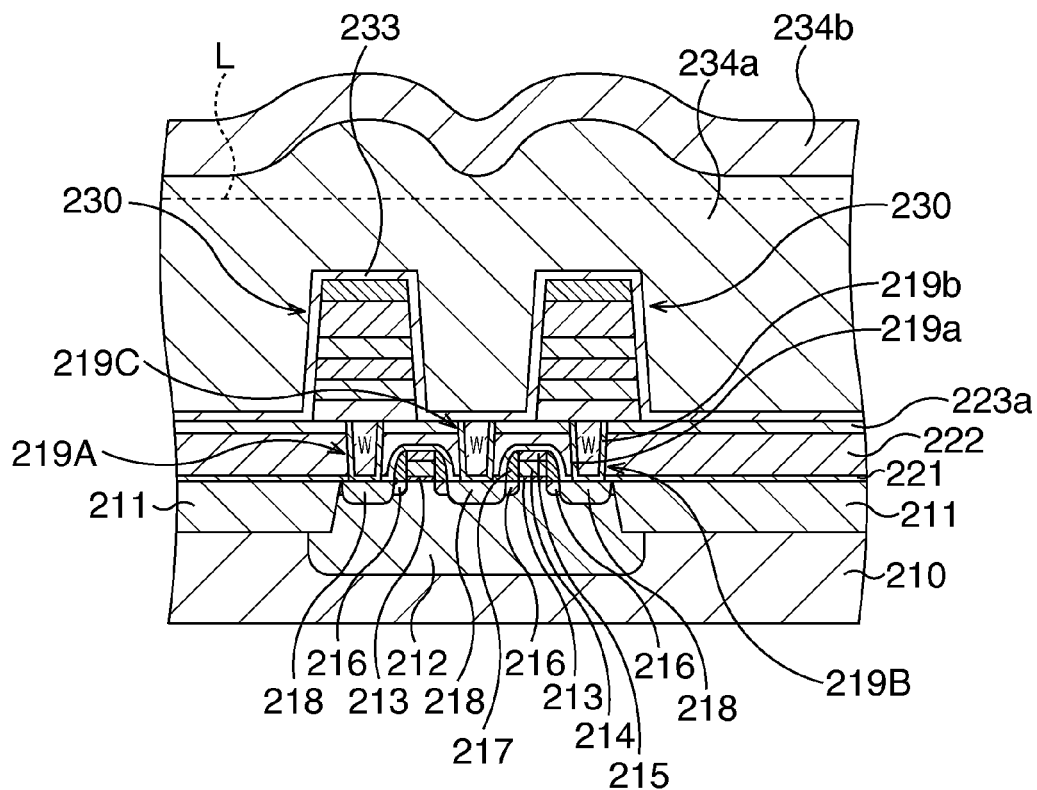
FIG. 20 is a schematic sectional view showing only the main process step, in the method for manufacturing the stack type FeRAM according to a modified example 1 of the second embodiment.
Figure 21:
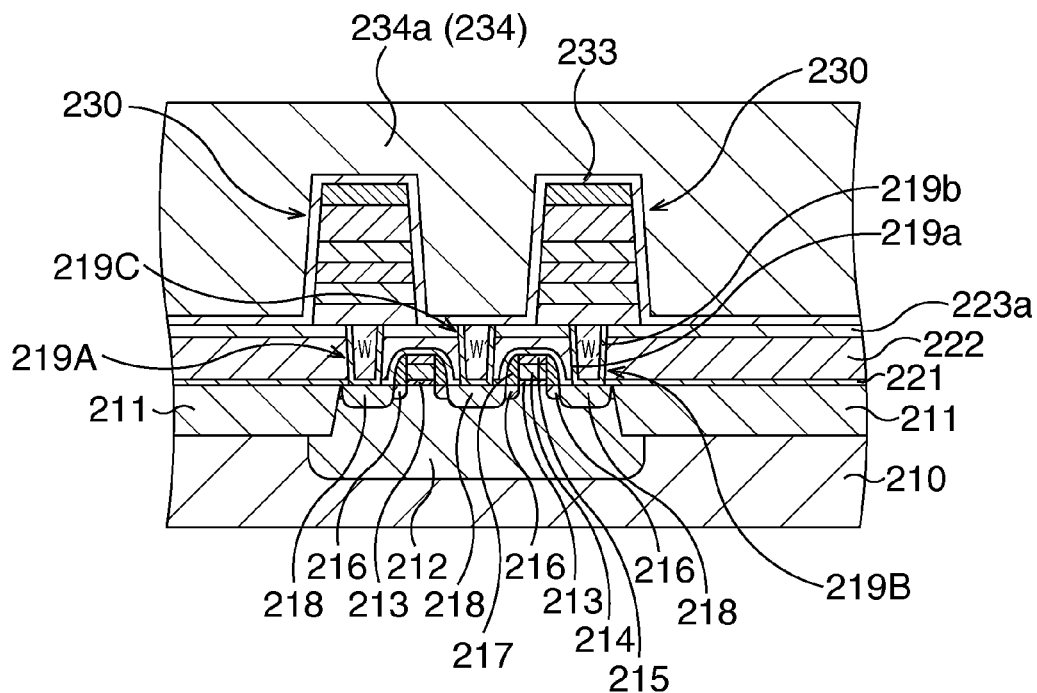
FIG. 21 is a schematic sectional view showing only the main process step, in the method for manufacturing the stack type FeRAM according to the modified example 1 of the second embodiment.
Figure 22:
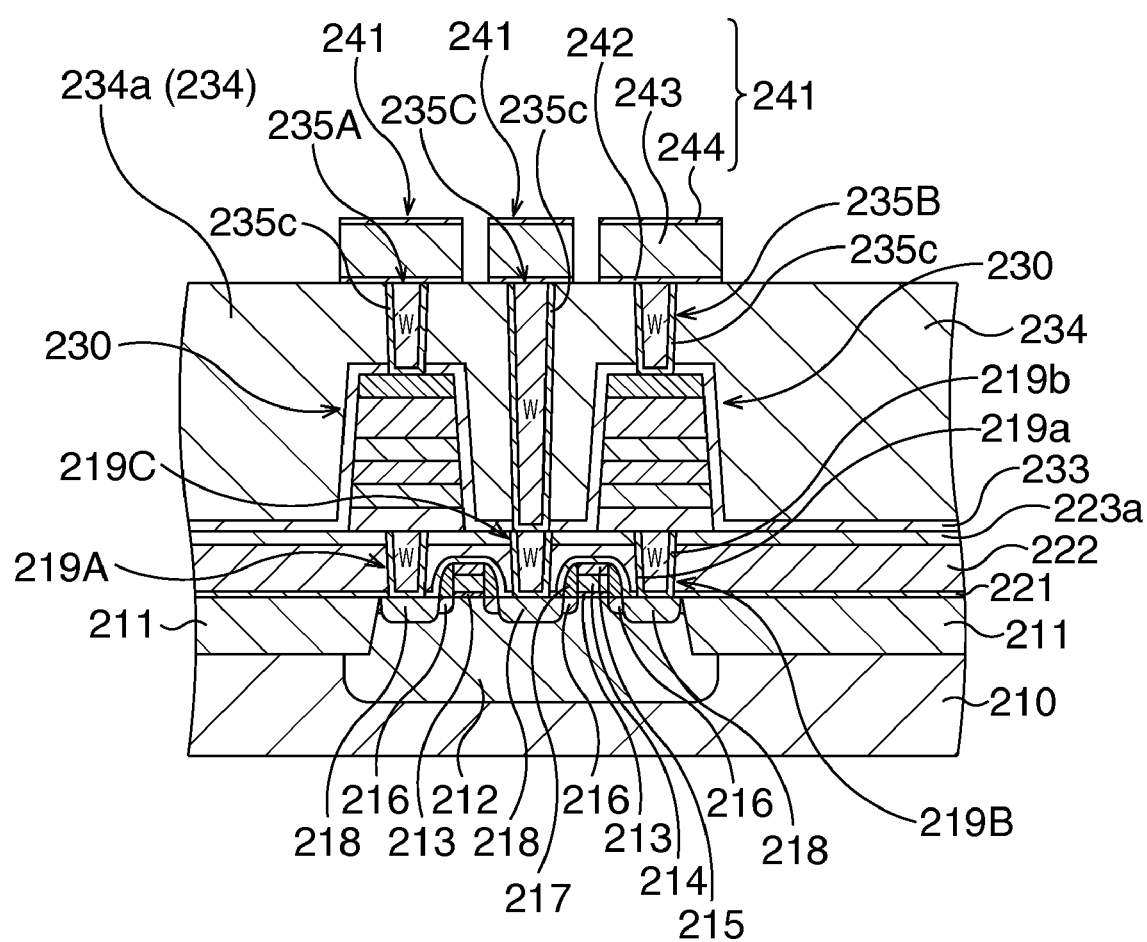
FIG. 22 is a schematic sectional view showing only the main process step, in the method for manufacturing the stack type FeRAM according to the modified example 1 of the second embodiment.

FIGS. 20 to 22 are schematic sectional views showing only main process steps in a manufacturing method of a stack type FeRAM according to a modified example 1 of the second embodiment.

First, as in the second embodiment, the modified example 1 goes through the respective process steps in FIGS. 12A to 16A.

Subsequently, similarly to FIG. 16B, the first insulation film 234a and the second insulation film 234b are sequentially deposited on the entire surface as shown in FIG. 20. In this case, the first insulation film 234a is formed to a film thickness of about 900 nm, and the second insulation film 234b is formed to a film thickness of about 500 nm, respectively.

Subsequently, as shown in FIG. 21, surface flattening is performed by polishing the first and the second insulation films 234a and 234b, and the interlayer insulation film 234 is formed.

In detail, the interlayer insulation film 234 is formed by polishing the first and the second insulation films 234a and 234b until, for example, the film thickness becomes about 700 nm by CMP, up to the position shown by the broken line L in FIG. 20, for example. Here, polishing is performed so that the second insulation film 234b is wholly removed, and only the first insulation film 234a remains. At this time, the interlayer insulation film 234 for which surface flattening is performed, and constituted of only the first insulation film 234a is formed.

In the interlayer insulation film 234, only the first insulation film 234a which has an extremely low moisture content and inferior in surface flatness when solely adopted remains, but the ferroelectric capacitor structure 230 is sufficiently protected from entry of moisture/hydrogen, and excellent surface flatness is obtained. In concrete, the in-plane film thickness distribution rate becomes 3% or less.

After the CMP, plasma annealing treatment of $N_2O$, for example, is applied for the purpose of dehydration and surface improvement of the interlayer insulation film 234.

Thereafter, as in the second embodiment, through each of the process steps in FIGS. 17B to 19, and various process steps of formation of the interlayer insulation films, the upper layer wirings and the like, the stack type FeRAM according to this example is completed as shown in FIG. 22.

As described above, according to this example, the interlayer insulation film 234 which prevents entry of moisture/hydrogen into the ferroelectric capacitor structure 230 as much as possible, but has extremely excellent surface flatness with extremely low in-plane film thickness distribution is formed, and the stack type FeRAM with high reliability with influence on the dielectric characteristics, variation in contact resistance and the like suppressed is realized.

Modified Example 2

Figure 23:
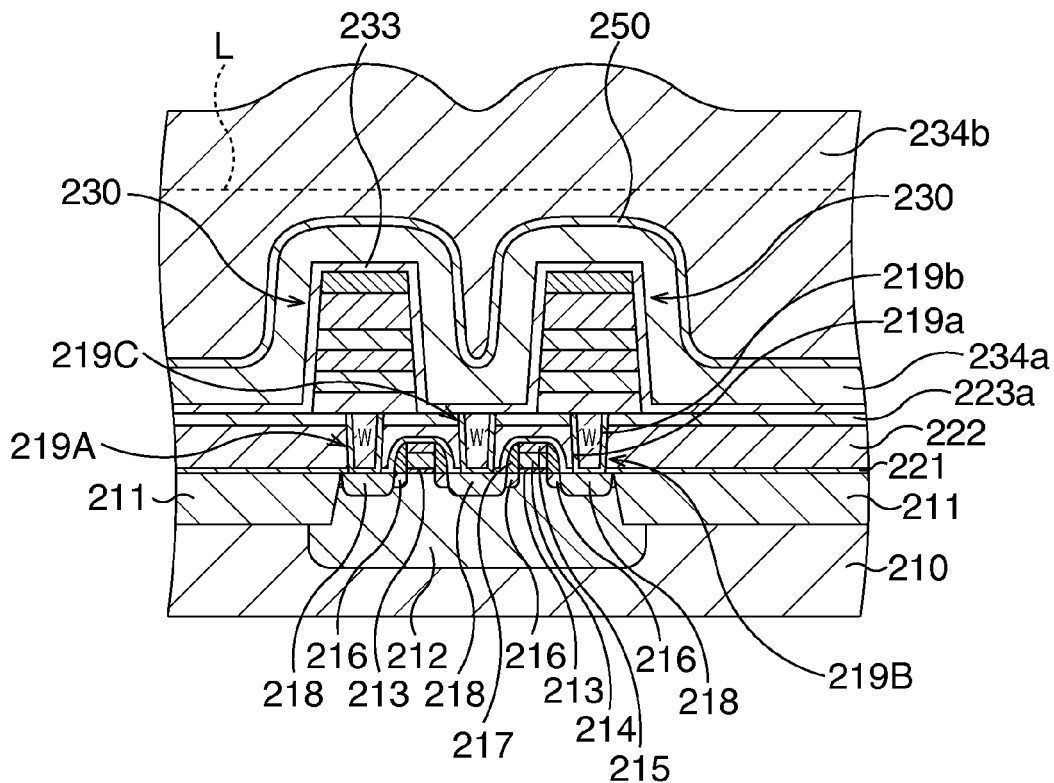
FIG. 23 is a schematic sectional view showing only the main process step, in the method for manufacturing the stack type FeRAM according to a modified example 2 of the second embodiment.
Figure 24:
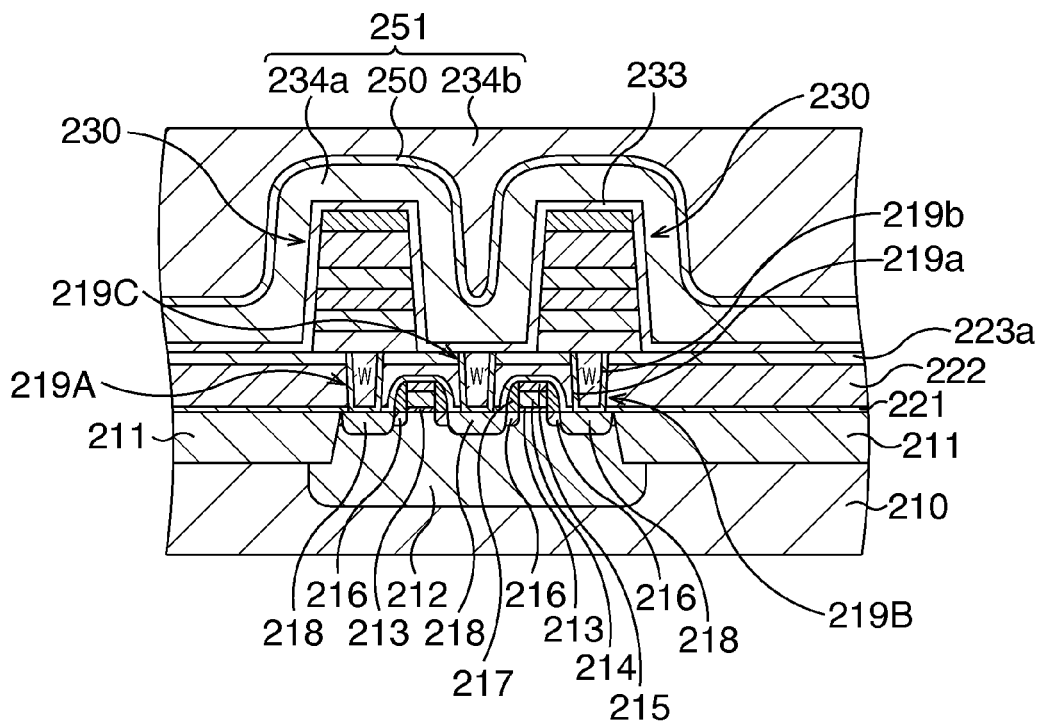
FIG. 24 is a schematic sectional view showing only the main process step, in the method for manufacturing the stack type FeRAM according to the modified example 2 of the second embodiment.
Figure 25:
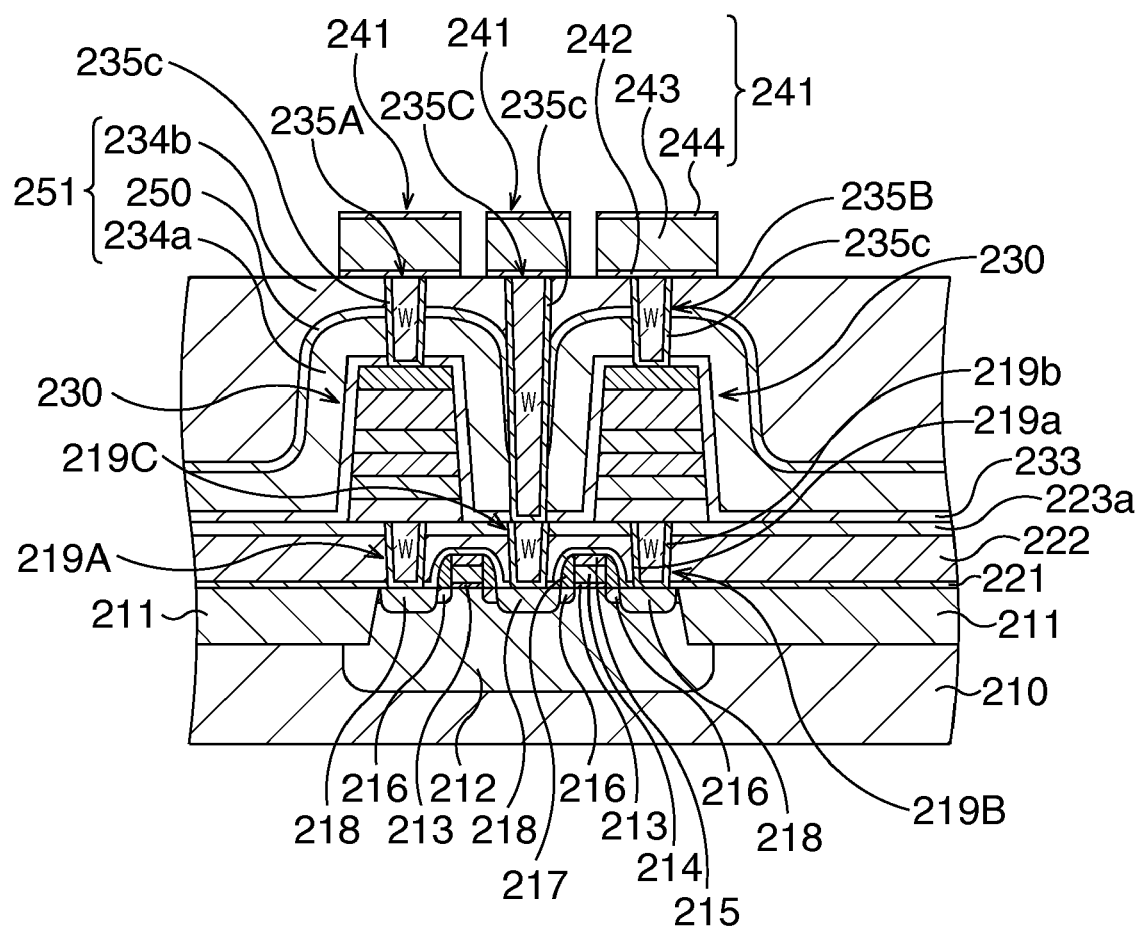
FIG. 25 is a schematic sectional view showing only the main process step, in the method for manufacturing the stack type FeRAM according to the modified example 2 of the second embodiment.

FIGS. 23 to 25 are schematic sectional views showing only main process steps in a manufacturing method of a stack type FeRAM according to a modified example 2 of the second embodiment.

First, as in the second embodiment, the modified example 2 goes through the respective process steps in FIGS. 12A to 16A.

Subsequently, as shown in FIG. 23, the first insulation film 234a, a thin hydrogen diffusion prevention film 250 covering the first insulation film 234a and the second insulation film 234b are sequentially deposited on the entire surface to cover the ferroelectric capacitor structures 230. The hydrogen diffusion prevention film 250 is formed by a sputtering method or a CVD method (for example, an MOCVD method) by using at least one kind of material selected from a group constituted of $Al_2O_3$ (alumina), Al nitrogen oxide, Ta oxide and Ti oxide, alumina in this case, as a material. Here, the first insulation film 234a is formed to a film thickness of about 300 nm, the hydrogen diffusion prevention film 250 is formed to a film thickness of about 50 nm, and the second insulation film 234b is formed to a film thickness of about 1100 nm, respectively.

Subsequently, as shown in FIG. 24, surface flattening is performed by polishing the second insulation film 234b, and an interlayer insulation film 251 is formed.

In detail, the interlayer insulation film 251 is formed by polishing the second insulation film 234b until the film thickness becomes, for example, about 700 nm by CMP, up to the position shown by the broken line L in FIG. 23, for example. Here, only the second insulation film 234b is polished. At this time, surface flattening is performed for the second insulation film 234b, and the interlayer insulation film 251 made by sequentially stacking the first insulation film 234a, the hydrogen diffusion prevention film 250 and the second insulation film 234b is formed.

In the interlayer insulation film 251, the ferroelectric capacitor structures 230 are sufficiently protected from entry of moisture/hydrogen by the first insulation film 234a and the hydrogen diffusion prevention film 250 which cover the ferroelectric capacitor structures 230, and excellent surface flatness is obtained by the second insulation film 234b. In concrete, the in-plane film thickness distribution rate becomes 3% or less.

After the CMP, plasma annealing treatment of $N_2O$, for example, is performed for the purpose of dehydration and surface improvement of the interlayer insulation film 251.

Thereafter, as in the first embodiment, through each of the process steps in FIGS. 17B to 19, and various process steps of formation of the interlayer insulation films, the upper layer wirings and the like, the stack type FeRAM according to this example is completed as shown in FIG. 25.

As described above, according to this example, the interlayer insulation film 251 which prevents entry of moisture/hydrogen into the ferroelectric capacitor structures 230 as much as possible, but has extremely low in-plane film thickness distribution and extremely excellent surface flatness is formed, and the stack type FeRAM with high reliability with influence on the dielectric characteristics, variation in contact resistance and the like suppressed is realized.

According to the present invention, the interlayer insulation film which prevents entry of moisture/hydrogen into the capacitor structures as much as possible, but has extremely low in-plane film thickness distribution and extremely excellent surface flatness is formed, and the semiconductor device with high reliability with influence on the dielectric characteristics, variation in contact resistance and the like suppressed can be realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a semiconductor substrate;
   a capacitor structure which is formed over said semiconductor substrate, and is formed by sandwiching a capacitor film formed from a dielectric material by a lower electrode and an upper electrode; and
   an interlayer insulation film formed to cover said capacitor structure,
   wherein said interlayer insulation film includes
   a first insulation film that covers said capacitor structure, has a first portion which is located over the capacitor structure formed to be higher than a second portion, and is formed from a first insulating material, and
   a second insulation film which is formed over the second portion of the first insulation film, and is formed from a second insulating material with a higher moisture content than the first insulating material, and
   a top surface of the first portion in the first insulation film and a top surface of the second insulation film are continuously flat and coplanar.

2. The semiconductor device according to claim 1, wherein the first insulation film has an in-plane film thickness distribution rate of 5% or less, and the second insulation film has an in-plane film thickness distribution rate of 2% or less.

3. The semiconductor device according to claim 1, wherein said interlayer insulation film has an in-plane film thickness distribution rate of 3% or less.

4. The semiconductor device according to claim 1, wherein said capacitor film is formed from a ferroelectric material.

* * * * *